(12) United States Patent
Matsuzawa et al.

(10) Patent No.: US 6,420,269 B2
(45) Date of Patent: *Jul. 16, 2002

(54) CERIUM OXIDE ABRASIVE FOR POLISHING INSULATING FILMS FORMED ON SUBSTRATE AND METHODS FOR USING THE SAME

(75) Inventors: Jun Matsuzawa; Yasushi Kurata, both of Tsukuba; Kiyohito Tanno, Hitachi; Yoshio Honma, Tokyo, all of (JP)

(73) Assignee: Hitachi Chemical Company, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/930,916

(22) PCT Filed: Feb. 7, 1997

(86) PCT No.: PCT/JP97/00326

§ 371 (c)(1),
(2), (4) Date: Dec. 30, 1997

(87) PCT Pub. No.: WO97/29510

PCT Pub. Date: Aug. 14, 1997

(30) Foreign Application Priority Data

| Feb. 7, 1996 | (JP) | 8-021563 |
| Mar. 29, 1996 | (JP) | 8-077805 |
| Mar. 29, 1996 | (JP) | 8-077806 |
| Mar. 29, 1996 | (JP) | 8-077807 |
| Mar. 29, 1996 | (JP) | 8-077808 |
| Mar. 29, 1996 | (JP) | 8-077809 |
| Mar. 29, 1996 | (JP) | 8-077810 |
| Mar. 29, 1996 | (JP) | 8-077811 |
| Mar. 29, 1996 | (JP) | 8-077812 |
| Mar. 29, 1996 | (JP) | 8-077813 |
| Apr. 1, 1996 | (JP) | 8-078734 |

(51) Int. Cl.⁷ .................. H01L 21/302; H01L 21/461
(52) U.S. Cl. .................. 438/693; 51/307; 216/89; 438/633; 438/692
(58) Field of Search .................. 51/308, 307; 106/2, 106/3; 216/89; 423/263; 438/633, 690, 691, 692, 693

(56) References Cited

U.S. PATENT DOCUMENTS

| 4,022,625 A | * 5/1977 | Shelton ................. 106/3 |
| 4,529,410 A | * 7/1985 | Khaladji et al. ........... 51/309 |
| 4,601,755 A | * 7/1986 | Melard et al. ............ 106/3 |
| 4,663,137 A | * 5/1987 | Chane-Ching et al. ...... 423/263 |
| 4,769,073 A | * 9/1988 | Tastu et al. .............. 106/3 |

(List continued on next page.)

FOREIGN PATENT DOCUMENTS

| FR | 2583034 | * 12/1986 |
| FR | 2 583 034 A | 12/1986 |
| JP | 1-266183 | 10/1989 |
| JP | 2-081431 | 3/1990 |
| JP | 4-55315 | 2/1992 |
| JP | 4-055315 | 2/1992 |
| JP | 5-166780 | 7/1993 |

(List continued on next page.)

*Primary Examiner*—Michael J. Sherry
*Assistant Examiner*—Asok Kumar Sarkar
(74) *Attorney, Agent, or Firm*—Griffin & Szipl, P.C.

(57) ABSTRACT

The invention relates to an abrasive containing a slurry of the cerium oxide grains dispersed in water. The Cerium oxide grains are obtained by adding hydrogen peroxide to an aqueous dispersion of cerium carbonate. The Cerium oxide grains are obtained by oxidizing a precipitate, which is formed through addition of ammonium hydrogencarbonate to an aqueous solution of cerium nitrate, with hydrogen peroxide. The Cerium oxide grains are obtained by neutralizing or alkallfying an aqueous solution of cerium ammonium nitrate.

75 Claims, 2 Drawing Sheets

U.S. PATENT DOCUMENTS

| | | | | |
|---|---|---|---|---|
| 4,786,325 A | * | 11/1988 | Melard et al. | 106/3 |
| 4,942,697 A | * | 7/1990 | Khaladji et al. | 51/309 |
| 4,965,057 A | * | 10/1990 | David et al. | 423/263 |
| 5,011,671 A | * | 4/1991 | Le Loarer | 423/263 |
| 5,026,421 A | * | 6/1991 | Le Loarer et al. | 106/3 |
| 5,264,010 A | * | 11/1993 | Brancaleoni et al. | 51/308 |
| 5,389,352 A | * | 2/1995 | Wang | 423/263 |
| 5,443,604 A | * | 8/1995 | Stowell | 51/307 |
| 5,445,996 A | * | 8/1995 | Kodera et al. | 438/633 |
| 5,634,965 A | * | 6/1997 | Delcroix | 106/2 |
| 5,759,917 A | * | 6/1998 | Grover et al. | 438/690 |
| 5,896,870 A | * | 4/1999 | Huynh et al. | 134/1.3 |
| 5,952,243 A | * | 9/1999 | Forester et al. | 438/693 |
| 5,962,343 A | * | 10/1999 | Kasai et al. | 438/693 |
| 6,093,649 A | * | 7/2000 | Roberts et al. | 438/691 |

FOREIGN PATENT DOCUMENTS

| | | |
|---|---|---|
| JP | 5-326467 | 12/1993 |
| JP | 5-3326469 | 12/1993 |
| JP | 6-72711 | 3/1994 |
| JP | 6-302570 | 10/1994 |
| JP | 7-502778 | 3/1995 |
| JP | 11-320418 | 11/1999 |
| JP | 11-330015 | 11/1999 |
| JP | 11-330016 | 11/1999 |
| JP | 11-330017 | 11/1999 |
| JP | 11-330018 | 11/1999 |
| JP | 11-330019 | 11/1999 |
| JP | 11-330020 | 11/1999 |
| JP | 11-330021 | 11/1999 |
| WO | WO 95 03252 | 2/1995 |

* cited by examiner

CERIUM OXIDE ABRASIVE FOR POLISHING INSULATING FILMS FORMED ON SUBSTRATE AND METHODS FOR USING THE SAME

TECHNICAL FIELD

The present invention relates to a cerium oxide abrasive, a method for producing the cerium oxide abrasive, a method for polishing substrates, a method for producing semiconductor chips, a semiconductor chip, a method for producing semiconductor devices, and a semiconductor device.

BACKGROUND ART

With the recent noticeable increase In the density and the degree of integration of ultra-LSIs, which requires multi-layered structures of aluminium wiring and fine wiring patterns, it is desired to reduce the minimum line width of wiring patterns to be processed. Therefore, for the interlayer insulating films to be in those LSIs, required is a flattening technique of flattening their surfaces with the films filling up in the distance between the adjacent fine wiring lines with no empty space therebetween.

In general, such interlayer insulating films which needs to be flattened are formed through vapor deposition such as plasma CVD or ECR-CVD, or through coating such as SOG. Of those, SOG comprises applying a coating liquid that is prepared by hydrolyzing an alkoxysilane and an alkylalkoxysilane with water and a catalyst in an organic solvent such as an alcohol, onto a substrate through spin coating, followed by curing it through heat treatment, and the thus-coated film is then flattened. For this, for example, mainly employed Is an organic SOG film which contains the organic component (e.g., alkyl group) remaining therein in order to be thick without being cracked. The organic SOG film is advantageous in that its volume is shrunk little when it is cured, that it is hydrophobic and that its dielectric constant is low. However, the organic SOG film is not satisfactorily applicable to global flattening of uneven surfaces caused by complicated sparse and dense wiring, though being applicable to local flattening of a part of such uneven surfaces.

As the material for forming the interlayer insulating films, silicon-free, organic polymer resins with good insulation performance and adhesiveness are being tried. For example, a coating liquid as prepared by dissolving such a silicon-free, organic polymer resin in an organic solvent such as an alcohol is applied onto a substrate through spin coating, and thereafter heated to form an insulating film on the substrate. This method produces thick insulating films relatively with ease.

Multi-layered wiring structures are much used In ultra-LSIs in order to make them have a higher density and a higher degree of integration. In particular, current logic LSI devices have four-layered or higher poly-layered structures, in which, therefore, the difference in surface level is increasing. On the other hand, the focal depth of resists to be used for patterning of wiring in those devices is being reduced with the reduction in the wiring width of the patterns, and such a high difference in surface level in those fine patterns is problematic. In order to solve this problem, it is desired to globally flatten the fine patterns. As one method for this, it is expected to apply to the fine patterns a chemical mechanical polishing (CMP) technique which has heretofore been used for polishing Si wafers and which produces a synergistic effect of the chemical polishing action and the mechanical polishing action.

Of insulating films, those formed through CVD could be relatively easily polished with an abrasive slurry comprising a dispersion of colloidal silica, which has heretofore been used in polishing Si wafers. However, CVD is problematic in that grooves with a high aspect ratio to be between fine lines of wiring patterns are poorly filled up through CVD, and it is said that CVD is limitedly applicable to grooves having an aspect ratio of at most 3 or so. In order to lower the dielectric constant of insulating films, the introduction of fluorine into the films is tried, for which, however, there are still outstanding problems in that the fluorine once introduced into the films is often expelled therefrom and that the hygroscopicity of the films increases.

On the other hand, organic SOG films formed through SOG are advantageous in that even grooves with a high aspect ratio can be well filled up with the films, and it is said that grooves having an aspect ratio of 10 or larger could be filled up therewith. In addition, those organic SOG films have a low dielectric constant of 3 or so in themselves, and the costs for producing the films are lower than those for producing CVD films. However, when the organic SOG films are polished with a colloidal silica-containing abrasive such as that mentioned above, they are often scratched. If they are polished with the abrasive under a mild condition in order to protect them from being scratched, the polishing speed is greatly lowered. In addition, even if polished under the same condition, the polishing speed for the organic SOG films is significantly lower than that for CVD films. Therefore, if the organic SOG films are desired to be used in the art as they are, their costs shall be too high, resulting in that their use in the art is impracticable. Given that situation, it is desired to develop an abrasive capable of polishing those organic SOG films at a high speed.

On the other hand, organic polymer resin films can form thick films having a thickness of 10 $\mu$m or larger in one-pass coating, and it is considered that the films will be effectively usable in global flattening of fine patterns, Those films have a low dielectric constant of 3 or so in themselves, and their dielectric constant may be reduced more if fluorine is introduced thereinto. Acrylate polymer films can be formed with UV rays without being heated. However, since the hardness of those organic polymer resin films is much lower than that of CVD films and organic SOG films, the organic polymer resin films are scratched if polished with a colloidal silica-containing abrasive such as that mentioned above. In order to protect the films from being scratched, if the polishing condition is made mild to such a degree that the films are not scratched, the films could not almost be polished under such a mild condition. Therefore, it is desired to develop an abrasive capable of polishing the organic polymer resin films without scratching them.

DISCLOSURE OF THE INVENTION

The present invention is to provide a cerium oxide abrasive favorably used for polishing insulating films such as organic SOG films and organic polymer resin films which have a low dielectric constant and can be globally flattened and with which even grooves between fine wiring lines can be filled up; a method for producing the cerium oxide abrasive; a method for polishing substrates using the cerium oxide abrasive; a method for producing semiconductor chips using the polishing method; a semiconductor chip; a method for producing semiconductor devices; and a semiconductor device.

Specifically, the invention provides a cerium oxide abrasive for polishing an insulating film formed on a predetermined substrate, which comprises a slurry of cerium oxide grains dispersed in water. Desirably, this slurry comprises 100 parts by weight of a water solvent and not larger than 10 parts by weight of cerium oxide grains dispersed in the solvent. The invention also provides a method for producing the cerium oxide abrasive, which comprises a step of dispersing cerium oxide grains in water to prepare a slurry.

The cerium oxide grains to be used herein are desirably at least any of the following (1) to (11).

(1) Cerium oxide grains as obtained by oxidizing a water-insoluble, tri-valent cerium compound as dispersed in water, with an oxidizing agent.

(2) Cerium oxide grains as obtained by oxidizing a water-insoluble cerium compound, which is obtained from an aqueous solution of a water-soluble, tri-valent cerium compound, with an oxidizing agent.

For those (1) and (2), the oxidizing agent is preferably hydrogen peroxide.

(3) Cerium oxide grains as obtained by neutralizing or alkalifying an aqueous solution of a tetra-valent cerium compound.

(4) Cerium oxide grains having a specific surface area of not smaller than 25 $m^2/g$.

(5) Cerium oxide grains having an apparent density as measured in a still standing method of not larger than 1.30 g/ml.

(6) Cerium oxide grains having an apparent density as measured in a tapping method of not larger than 1.60 g/ml.

(7) Cerium oxide grains of which the powdery X-ray diffraction pattern gives a main peas having a half-value width of not smaller than 0.4°.

(8) Cerium oxide grains of which the primary grains having a primary grain size of not larger than 10 nm, as observed through transmitting electromicroscopy, are not smaller than 90% of the total number of the grains.

(9) Cerium oxide grains of which the primary grains having a primary grain size of not larger than 10 nm are not smaller than 90% of the total number of the primary grains and the secondary grains as formed through aggregation of the primary grains to have a secondary grain size not larger than 1 $\mu$m are not smaller than 90% of the total number of of the secondary grains.

(10) Cerium oxide grains of which the secondary grains having a diameter of not larger than 1 $\mu$m are not smaller than 90% of the total number of the grains and in which the secondary grains each give an outline with no edges having an angle of smaller than 120°.

(11) Cerium oxide grains of which the primary grains having an aspect ratio of not larger than 2.0 are not smaller than 90% of the total number of the grains.

Preferably, the slurry contains a dispersant. The dispersant may be at least one selected from, for example, water-soluble organic polymers, water-soluble anionic surfactants, water-soluble nonionic surfactants and water-soluble amines. Preferably, the slurry is alkaline, especially preferably having a pH of from 8 to 12.

The present invention further provides a method for polishing substrates, which comprises a step of forming an insulating film on a predetermined substrate followed by polishing the insulating film with the cerium oxide abrasive mentioned above. This polishing method is s especially suitable for polishing insulating layers of semiconductor substrates. The invention still further provides a method for producing semiconductor chips, which comprises a step of forming an insulating film that comprises an insulating layer containing a compound having an organic group on a semiconductor substrate, followed by polishing the insulating layer containing a compound having an organic group with the cerium oxide abrasive mentioned above, and provides the semiconductor chips as produced by the method. The invention still further provides a method for producing semiconductor devices, which comprises a step of mounting the semiconductor chips on a support substrate followed by encupsiating the semiconductor chips with a sealant, and provides the semiconductor devices as produced by the method.

The insulating film may be either a single-layered one or a multi-layered one comprising two or more insulating layers. In the latter multi-layered insulating film, at least one of those plural insulating layers shall be selectively polished with the cerium oxide abrasive mentioned above.

Preferably, the multi-layered insulating film composed of such a plurality of insulating layers comprises an insulating layer containing a organic compound having an organic group. The insulating layer containing a compound having an organic group may be formed, for example, by applying a coating liquid, which is obtained by hydrolyzing an alkoxysilane and an alkylaikoxysilane in the presence of water and a catalyst in an organic solvent, onto a substrate, followed by curing it under heat. It is desirable that the insulating film comprises this insulating layer as formed through thermal curing of the hydrolysate, and an insulating layer comprising $SiO_2$. The cerium oxide abrasive of the invention can selectively polish the insulating layer comprising a compound having an organic group.

It is preferable that the number of the Si atoms derived from a siloxane bond and the number of the C atoms derived from an alkyl group have the relationship as follows:

(Number of C atoms)/[((Number of Si atoms)+(Number of C atoms)]≧0.1 in this insulating layer comprising a compound having an organic group.

A silicon-free, organic polymer resin layer may be used as the layer in the multi-layered insulating film.

The present invention provides a method for polishing a substrate in which the insulating film is polished with the cerium oxide abrasive, and the ratio of the polishing speed for the first insulating layer to that for the second insulating layer is not smaller than 10 when the substrate has thereon a multi-layered insulating film comprising two or more insulating layers. In this, the first insulating layer and the second insulating layer are, for example, the insulating layer comprising a compound having an organic group and the $SiO_2$ insulating layer, respectively.

Preferably, the substrate-polishing method of the invention comprises an additional step of washing the substrate, of which the insulating layer has been polished, with a liquid comprising at least one selected from a mixture of hydrogen peroxide and nitric acid, and sulfuric acid, ammonium carbonate, ammonium carbamate and ammonium hydrogencarbonate.

In general, cerium oxide is obtained by baking a cerium compound (e.g., hydroxide, carbonate, sulfate, oxalate, etc.), which is separated and purified from typical rare earth minerals such as bastnaesite and mosandrite. Where organic SOG films are polished with the cerium oxide abrasive, if cerium oxide of the abrasive has a too high degree of crystalilnity, the polishing speed with the abrasive is often lowered. Therefore, the cerium oxide grains for use in the invention shall be prepared without too much increasing their crystallinity. In addition, since the abrasive is used for polishing semiconductor chips, it is desirable that the alkali metal content and the halogen content of the abrasive are controlled to be not larger than 1 ppm in order to prevent any undesirable introduction of impurities into the polished chips.

To prepare the cerium oxide grains in the invention, preferably employed are the following methods:

(1) A method starting from a water-insoluble, tri-valent cerium compound, in which the compound is dispersed in water and an oxidizing agent is dropwlse added thereto thereby oxidizing the compound, while it is solid, to obtain tetra-valent cerium oxide grains.

(2) A method starting from a water-soluble, tri-valent cerium compound, in which ammonium hydrogencarbonate or the like is added to an aqueous solution comprising the cerium compound to give a water-insoluble cerium compound (as a precipitate) and an oxidizing agent is then dropwise added thereto thereby oxidizing the resulting water-insoluble cerium compound, while it is solid, to obtain tetra-valent cerium oxide grains.

(3) A method starting from a tetra-valent cerium salt, in which aqueous ammonia is added to an aqueous solution of the cerium salt thereby neutralizing or alkalifying the solution to give tetra-valent cerium oxide grains.

The water-insoluble, tri-valent cerium compound to be used herein is not specifically defined, including, for example, water-insoluble cerium salts such as cerium carbonate, cerium hydroxide, cerium oxalate and cerium acetate or the like. The water-insoluble, tri-valent cerium compound may be dispersed in water by any means, for example, using ordinary stirrers, or using homogenizers, ultrasonic dispersing machines or ball mills. Since it is preferable to finely disperse the grains of the compound for facilitating the subsequent oxidization of the grains, the dispersion is desirably effected using ball mills. The concentration of the water-insoluble, tri-valent cerium compound is not specifically defined, but is preferably from 1 to 30% by weight in view of the easiness in handling the resulting dispersion. By adding an oxidizing agent to the dispersion of the water-insoluble, tri-valent cerium compound, the cerium compound can be oxidized, while it is solid, to give tetra-valent cerium oxide grains. The oxidizing agent to be used herein includes, for example, nitrates such as potassium nitrate; permanganates such as potassium permanganate; chromates such as potassium chromate; and hydrogen peroxide, halogens, and ozone. Of those, preferred is hydrogen peroxide in order to prevent the oxidation from being accompanied by the introduction of impurities into the oxidized grains. The amount of the oxidizing agent to be added must be not smaller than one mol, relative to one mol of the water-insoluble, tri-valent cerium compound, in order to complete the oxidation, the amount is preferably from 1 to 10 mols. The processing temperature for the oxidation is not specifically defined. When a self-decomposing oxidizing agent, such as hydrogen peroxide, is used, it is desirable to start the oxidation at a temperature no higher than 40° C., and to heat at 80° C. or higher in order to decompose the excess oxidizing agent after the addition of the entire amount of the oxidizing agent to the reaction system. To recover the grains as obtained after the oxidation, employable is any ordinary means such as decantation, filtration or centrifugation or the like. Preferred is centrifugation as being able to efficiently separate the oxidized grains within a short period of time. However, if the reaction system is acidic, the grains precipitate too slowly and the system is therefore difficult to centrifuge through solid-liquid separation using ordinary centrifugers. Therefore, it is preferable to make the system have a pH of not smaller than 8 by adding thereto any non-metallic alkaline substance such as ammonia, prior to its centrifugation. In order to reduce the impurity content of the isolated grains, it is effective to repeatedly wash the precipitate. The thus-recovered precipitate of cerium oxide grains may be directly used herein as it is, but, if desired, it may be dried by a dryer or the like to remove water therefrom. The drying temperature is not specifically defined. However, if dried at 420° C. or higher, the cerium oxide grains shall have an extremely increased degree of crystallinity. Therefore, it is desired to dry the precipitate at a temperature as low as possible to be not higher than 420° C.

The water-soluble, tri-valent cerium compound is not specifically defined, including, for example, water-soluble cerium salts such as cerium nitrate, cerium sulfate and cerium chloride or the like. The concentration of the compound in its aqueous solution is not also specifically defined. However, in view of the easiness in handling the resulting suspension comprising a precipitate of the water-insoluble cerium compound formed, the concentration is preferably from 1 to 30% by weight. When an aqueous solution of ammonium hydrogencarbonate or the like is added to the aqueous solution of the compound, the solution gives a white precipitate (of a water-insoluble cerium compound). The concentration of ammonium hydrogencarbonate to be added must be not smaller than 1.5 mols, relative to one mol of the water-soluble, tri-valent cerium compound. In order to complete the reaction, the concentration is preferably from 1.5 to 30 mols. By adding an oxidizing agent to the resulting dispersion of the precipitate (of a water-insoluble cerium compound) as formed from the water-soluble, tri-valent cerium compound, the precipitate can be oxidized, while it is solid, to give tetra-valent cerium oxide grains. The oxidizing agent to be used for this may be the same as that for the oxidation the water-insoluble, tri-valent cerium compound mentioned above. Preferred is hydrogen peroxide in order to prevent the oxidation from being accompanied by the introduction of impurities into the oxidized grains. The amount of the oxidizing agent to be added must be not smaller than one mol, relative to one mol of the water-soluble, tri-valent cerium compound. In order to complete the oxidation, the amount is preferably from 1 to 10 mols. The processing temperature for the oxidation is not specifically defined. When a self-decomposing oxidizing agent, such as hydrogen peroxide, is used, it is desirable to start the oxidation at a temperature not higher than 40° C., and to heat at 80° C. or higher in order to decompose the excess oxidizing agent after the addition of the entire amount of the oxidizing agent to the reaction system. To recover the grains as obtained after the oxidation, employable is any ordinary means such as decantation, filtration or centrifugation or the like. Preferred is centrifugation as being able to efficiently separate the oxidized grains within a short period of time. However, if the reaction system is acidic, the grains precipitate too slowly and the system is therefore difficult to centrifuge through solid-liquid separation using ordinary centrifugers. Therefore, it is preferable to make the system have a pH of not smaller than 8 by adding thereto any non-metallic alkaline substance such as ammonia, prior to its centrifugation. In order to reduce the impurity content of the isolated grains, it is effective to repeatedly wash the precipitate. The thus-recovered precipitate of cerium oxide grains may be directly used herein as it is, but, if desired, it may be dried by a dryer or the like to remove water therefrom, The drying temperature is not specifically defined. However, if dried at 420° C. or higher, the cerium oxide grains shall have an extremely increased degree of crystallinity. Therefore, it is desired to dry the precipitate at a temperature as low as possible to be not higher than 420° C.

The tetra-valent cerium compound is not specifically defined, including, for example, cerium salts such as cerium sulfate, cerium ammonium sulfate, and cerium ammonium nitrate or the like. The concentration of the compound in its aqueous solution is not also specifically defined. However, in view of the easiness in handling the resulting suspension comprising a precipitate (of cerium oxide grains formed), the concentration is preferably from 1 to 30% by weight. The aqueous solution of the cerium compound is acidic, but can be neutralized or alkalilfled by adding aqueous ammonia or the like thereto to give a white precipitate (of cerium oxide grains). The amount of aqueous ammonia to be added must be such that the suspension which is originally acidic is neutralized with the aqueous ammonia added thereto, and is preferably such that the suspension is finally alkalified For the latter, a little excess amount of aqueous ammonia may be added to the suspension. To recover the thus-precipitated grains, employable is any ordinary means such as decantation, filtration or centrifugation or the like. Preferred is centrifugation as being able to efficiently separate the oxidized grains within a short period of time. In order to reduce the impurity content of the isolated grains, it is effective to repeatedly wash the precipitate. The thus-recovered precipitate of cerium oxide grains may be directly used herein as it is, but, if desired, it may be dried by a dryer or the like to remove water therefrom. The drying temperature is not specifically defined. However, if dried at 420° C. or higher, the cerium oxide grains shall have an extremely increased degree of crystallinity. Therefore, it is desired to dry the precipitate at a temperature as low as possible to be not higher than 420° C.

In the present invention, used are cerium oxide grains having the following physical properties.

Specifically, the cerium oxide grains for use in the invention have a specific surface area of not smaller than 25 m$^2$/g but preferably not larger than 1,000 m$^2$/g, more preferably not smaller than 50 m$^2$/g but not larger than 500 m$^2$/g. if a slurry comprising cerium oxide grains with a specific surface area of smaller than 25 m$^2$/g as dispersed in water is used, the primary grain size of the grains is too large, and if an abrasive comprising the slurry is used for polishing objects, the surfaces of the objects are often scratched. If, on the other hand, cerium oxide grains with a specific surface area of larger than 1,000 m$^2$/g are used, the polishing speed with the abrasive comprising the grains is extremely low, resulting in that the abrasive could hardly exhibit its polishing effect. To measure the specific surface area of those grains, employable is any of nitrogen absorption method, nitrogen desorption method and mercury penetration method or the like, and the measuring method is not specifically defined. However, as being simple, nitrogen absorption method is preferred.

In the invention, the cerium oxide grains to be used have an apparent density as measured in a still standing method of preferably from 0.80 g/ml to 1.30 g/ml inclusive, more preferably from 0.90 g/ml to 1.20 g/ml inclusive. If a slurry comprising cerium oxide grains with an apparent density of larger than 1.30 g/ml as dispersed in water is used, the primary grain size of the grains is too large, and if an abrasive comprising the slurry is used for polishing objects, the surfaces of the objects are often scratched. If, on the other hand, cerium oxide grains with an apparent density of smaller than 0.80 g/ml are used, the polishing speed with the abrasive comprising the grains is extremely low, resulting in that the abrasive could hardly exhibit its polishing effect.

To measure the apparent density of those grains, known are static methods and dynamic methods, and any of which may be employable herein with no limitation. However, as being simple, preferred is the still standing method stipulated in JIS K-5101.

In the invention, the cerium oxide grains to be used have an apparent density as measured in a tapping method of preferably from 1.00 g/ml to 1.60 g/ml inclusive, more preferably from 1.05 g/ml to 1.55 g/ml inclusive. If a slurry comprising cerium oxide grains with an apparent density of larger than 1.6 g/ml as dispersed in water is used, the primary grain size of the grains is too large, and if an abrasive comprising the slurry is used for polishing objects, the surfaces of the objects are often scratched. If, on the other hand, cerium oxide grains with an apparent density of smaller than 1.00 g/ml are used, the polishing speed with the abrasive comprising the grains is extremely low, resulting in that the abrasive could hardly exhibit its polishing effect.

To measure the apparent density of those grains, known are static methods and dynamic methods, and any of which may be employable herein with no limitation. However, as being simple, preferred is the tapping method stipulated in JIS K-5101.

In the invention, the powdery X-ray diffraction pattern of the cerium oxide grains to be used gives a main peak having a half-value width of preferably from 0.4° to 5.0° inclusive, more preferably from 0.5° to 2.0° inclusive. Within the defined range, the abrasive comprising the cerium oxide grains exhibits a 10-fold or higher polishing speed in polishing organic SOG films and organic polymer resin films than in CVD films (of $SiO_2$), and is favorable for selectively polishing the former films. If a slurry comprising cerium oxide grains, of which the powdery X-ray diffraction pattern gives a main peak having a half-value width of smaller than 0.4°, as dispersed in water is used, the crystallinity of the grains is too high, and if an abrasive comprising the slurry is used for polishing objects, the surfaces of the objects are often scratched. In addition, since the polishing speed with the abrasive for polishing CVD films is elevated to be almost comparable to that for polishing organic SOG films and organic polymer resin films, the abrasive could not selectively polish only the latter films. If, on the other hand, cerium oxide grains, of which the powdery X-ray diffraction pattern gives a half-value width of larger than 5.0°, are used, the polishing speed with the abrasive comprising the grains is extremely low, resulting in that the abrasive could hardly exhibit its polishing effect.

The cerium oxide grains for use in the invention are such that the primary grains having a primary grain size of not larger than 10 nm are not smaller than 90% of the total number of the primary grains and that the secondary grains as formed through aggregation of the primary grains to have a secondary grain size of not larger than 1 $\mu$m are not smaller than 90% of the total number of the secondary grains. The measurement of the grain size of the grains is not specifically limited. As being simple, however, employed is transmitting electromicroscopic observation for the primary grain size, and scanning electromicroscopic observation or grain size distribution measurement for the secondary grain size. The cerium oxide grains failing within the defined range produce good polishing speed even when their concentration in the slurry comprising them is low, so that the costs for producing the slurry comprising them can be reduced. In addition, since the slurry having such a low concentration of the grains has a low viscosity, it can be easily fed into polishing devices with preventing the pipes, through which the slurry is fed into the devices, from being clogged with the grains. Moreover, since the slurry as dropped down onto a polishing pad can easily disperse thereon, the wafers on the pad can be uniformly polished. However, if a slurry comprising cerium oxide grains, of which the secondary grains as formed through aggregation of large primary grains with a primary grain size of larger than 10 nm have a secondary grain size of larger than 1 μm, as dispersed in water is used, and if an abrasive comprising the slurry is used for polishing objects, the surfaces of the objects are often scratched.

If so, in addition, the concentration of the grains in the slurry for the abrasive must be increased in order to attain the same polishing speed as above, which is often problematic in that the costs for producing the slurry are high and that the viscosity of the slurry is increased.

The cerium oxide grains for use in the present invention are such that the secondary grains having a diameter of not larger than 1 μm are not smaller than 90% of the total number of the grains and that the secondary grains each give an outline with no edges having an angle of smaller than 120°. The measurement of the size of the grains is not specifically limitted. As being simple, however, preferred is scanning electromicroscopic observation or grain size distribution measurement. The cerium oxide grains falling within the defined range produce good polishing speed even when their concentration in the slurry comprising them is low, so that the costs for producing the slurry comprising them can be reduced. In addition, since the slurry having such a low concentration of the grains has a low viscosity, it can be easily fed into polishing devices with preventing the pipes, through which the slurry is fed into the devices, from being clogged with the grains. Moreover, since the slurry as dropped down onto a polishing pad can easily disperse thereon, the wafers on the pad can be uniformly polished. However, if a slurry comprising cerium oxide grains, of which the secondary grains have a secondary grain size of larger than 1 μm, is used for polishing objects, the surfaces of the objects are scratched. If so, in addition, the concentration of the grains in the slurry must is increased in order to attain the same polishing speed as above, which is often problematic in that the costs for producing the slurry are high and that the viscosity of the slurry is increased. Even though the secondary grains have a secondary grain size of not larger than 1 μm, they will still often scratch the surfaces of the objects polished therewith if their outline has edges having an angle of smaller than 120°.

The cerium oxide grains for use in the invention are such that the primary grains having an aspect ratio of not larger than 2.0 are not smaller than 90% of the total number of the grains. If a slurry comprising cerium oxide grains, of which the primary grains have an aspect ratio of larger than 2.0, is used for polishing objects, the surfaces of the objects are often scratched. To determine the aspect ratio, preferably employed is a simple method of measuring the minor diameter and the major diameter of each grain through transmitting electromicroscopic observation, followed by obtaining the ratio of the two.

To produce the cerium oxide grains having the physical properties mentioned above, for example, preferably employed is any of the following methods, which are mentioned hereinabove. However, those methods are not specifically limitative.

(1) A method starting from a water-insoluble, tri-valent cerium compound, in which the compound is dispersed in water and an oxidizing agent is dropwise added thereto thereby oxidizing the compound, while it is solid, to obtain tetra-valent cerium oxide grains.

(2) A method starting from a water-soluble, tri-valent cerium compound, in which ammonium hydrogencarbonate or the like is added to an aqueous solution comprising the cerium compound to give a water-insoluble cerium compound (as a precipitate) and an oxidizing agent is then dropwlse added thereto thereby oxidizing the resulting water-insoluble cerium compound, while it is solid, to obtain tetra-valent cerium oxide grains.

(3) A method starting from a tetra-valent cerium compound, in which aqueous ammonia is added to an aqueous solution of the cerium salt thereby neutralizing or alkalifying the solution to give tetra-valent cerium oxide grains.

More preferably, the cerium oxide grains for use in the invention are provided with two or more of the following characteristics which have been referred to hereinabove.

(1) Their specific surface area is not smaller than 25 $m^2/g$.

(2) Their apparent density as measured in a still standing method is not larger than 1.3 g/ml.

(3) Their apparent density as measured in a tapping method is not larger than 1.6 g/ml.

(4) Their powdery X-ray diffraction pattern gives a main peak having a half-value width of not smaller than 0.4°.

(5) The primary grains that are found to have a primary grain size of not larger than 20 nm are not smaller than 90% of the total number of the grains.

(6) The primary grains having a primary grain size of not larger than 20 nm are not smaller than 90% of the total number of the primary grains, and the secondary grains as formed through aggregation of the primary grains to have a secondary grain size of not larger than 1 μm are not smaller than 90% of the total number of secondary grains.

(7) The secondary grains having a diameter of not larger than 1 μm are not smaller than 90% of the total number of the grains, and the secondary grains each give an outline with no edges having an angle of smaller than 120°.

(8) The primary grains having an aspect ratio of not larger than 2.0 are not smaller than 90% of the total number of the grains.

The cerium oxide slurry of the invention is obtained by dispersing a composition comprising water, the cerium oxide grains and preferably a dispersant. In the slurry, the concentration of the cerium oxide grains is not specifically defined, but is preferably between 1 and 30% by weight from the viewpoint of the easiness in handling the resulting suspension. Preferably, the cerium oxide grains are dispersed in an aqueous solvent in an amount of not larger than 10 parts by weight relative to 100 parts by weight of the aqueous solvent to give the intended slurry.

The dispersant is preferably a non-metallic one, and includes, for example, water-soluble organic polymers, such as acrylic acid polymers and their ammonium salts, methacrylic acid polymers and their ammonium salts, and polyvinyl alcohol; water-soluble anionic surfactants such as ammonium lauryl sulfate, and polyoxyethylene lauryl ether ammonium sulfate; water-soluble nonionic surfactants such as polyoxyethylene lauryl ether, and polyethylene glycol monostearate; and water-soluble amines such as monoethanolamine, and diethanolamine. The amount of the dispersant to be in the slurry is preferably from 0.1 parts by weight to 100 parts by weight, relative to 100 parts by weight of the cerium oxide grains, in view of the dispersibility of the grains and of the ability of the dispersant to prevent the grains from precipitating in the slurry. More preferably, in order to more highly disperse the grains in the slurry, the dispersant is put into the dispersing machine along with the grains prior to starting the dispersion of the grains in the machine. To disperse the cerium oxide grains in water, employable is any of ordinary dispersion method using general stirring machines, and that using homoger, ultrasonic dispersion machines and ball mill or the like. in order to disperse the cerium oxide grains to be fine grains of not larger than 1 μm in size in water, preferably employed are wet dispersing machines such as ball mills, shaking ball mills, planetary ball mills, and medium-stirring mills or the like. The slurry is preferably alkaline. If the alkali degree of the slurry is desired to be increased, a non-metallic alkaline substance, such as aqueous ammonia, may be added to the slurry during or after dispersing it. Preferably, the slurry has a pH of from 8 to 12.

The slurry of the invention may contain, in addition to the cerium oxide grains for example, any other oxides and salts of rare earth metals. Those additives, if any in the slurry, could improve the characteristics of the slurry, such as its dispersibility, chemical reactivity, slidability and selectivity. Preferably, the amount of the additives is not larger than 50% by weight of the total solid content of the slurry.

The insulating layer comprising a compound having an organic group, which is polished with the cerium oxide abrasive of the invention, can be formed by applying a coating liquid, which is prepared by hydrolyzing an alkoxysilane and an alkylalkoxysilane in the presence of water and a catalyst in an organic solvent such as an alcohol, onto a substrate through spin coating, followed by curing it under heat.

The alkoxysilane includes, for example, monomers such as tetramethoxysilane, tetraethoxysilane and tetrapropoxysilane, and their oligomers. These can be used herein either singly or as combined. The alkylaikoxysilane includes, for example, methyltrimethoxysilane, phenyltrimethoxysilane, dimethyidimethoxysilane, diphenyldimethoxysilane, aminopropyltrimethoxysilane, 3-glycidoxypropyltrinethoxysilane, 3-methacryloxypropyltrimethoxysilane, and vinyltrimethoxysilane. These can be used herein either singly or as combined. Apart from these, also employable herein are alkylalkoxysilanes of which at least a part of the alkyl moiety is fluorinated, such as fluorotrimethoxysilane, fluoromethyldimethoxysilane, trifluoromethyltrimethoxysilane, and trifluoromethylmethyldimethoxysilane; and alkoxysilanes and alkylalkoxysilanes with fluorine as bonded to Si. These can be used herein either singly or as combined. Preferably, the ratio of the amount of alkoxysilane to the amount of alkylalkoxysilane is to satisfy the following condition:

(number of C atoms)/(number of Si atoms+number of C atoms)≧0.1 in which the number of Si atoms and that of C atoms are derived from the siloxane bonds and the alkyl groups, respectively, in the insulating layer as formed from the coating liquid. If the ratio is smaller than 0.1, the film of the insulating layer formed is cracked, resulting in the defect such as a loss of film or lowering of the insulating performance.

The organic solvent includes, for example, monoalcohols such as methyl alcohol, and ethyl alcohol or the like; their ethers and esters; polyalcohols such as glycerin, and ethylene glycol or the like; their ethers and esters; and ketones such as acetone, and methyl ethyl ketone or the like. These can be used herein either singly or as combined. The catalyst may be any acid or alkali for hydrolysis, including, for example, inorganic acids such as hydrochloric acid, nitric acid, and phosphoric acid; organic acids such as acetic acid, and maleic acid or the like; their anhydrides and derivatives; and alkalis such as sodium hydroxide, ammonia, and methylamine or the like.

The amount of water to be in the hydrolyzing system is preferably smaller than 75% relative to 100% of the alkoxy group in the alkoxysilane and alkylalkoxysilane. If it is not smaller than 75% the alkoxysilane and alkylalkoxysilane are hydrolyzed too greatly, whereby the coating liquid formed is gelled or becomes cloudy. The amount of the catalyst to be added to the hydrolyzing system is preferably from 0.1 parts by weight to 5 parts by weight, relative to 100 parts by weight of the alkoxysilane and alkylalkoxysilane. If it is smaller than 0.1 parts by weight, the alkoxysilane and alkylalkoxysilane are hydrolyzed insufficiently so that the coating liquid could not form a film. On the other hand, however, if it is larger than 5 parts by weight, the alkoxysilane and alkylalkoxysilane are hydrolyzed too greatly, whereby the coating liquid formed is gelled. The amount of the alkoxysilane and alkylalkoxysilane is preferably between 1 part by weight and 40 parts by weight relative to 100 parts by weight of the organic solvent used. If the amount of the alkoxysilane and alkylalkoxysilane is smaller than 1 part by weight, the coating liquid could not form a film. If, on the other hand, it is larger than 40 parts by weight, the coating liquid could hardly form a uniform film. The reaction temperature at which the hydrolysate is processed to have an increased molecular weight is not specifically defined, but is preferably not higher than the boiling point of the organic solvent used. In order to suitably control the molecular weight of the thus-processed hydrolysate, the reaction temperature is preferably between 5° C. and 70° C. The reaction time for the hydrolysis is not also specifically defined. The hydrolysis may be stopped after the molecular weight of the hydrolysate formed has reached the predetermined one. The measurement of the molecular weight of the hydrolysate is not specifically defined. However, as being simple, preferably employed is liquid chromatography for the measurement.

The insulating layer-forming material comprising those four components may be prepared as follows: First, a predetermined amount of an alkoxysilane and a predetermined amount of an alkylalkoxysilane are dispersed in an organic solvent, to which are added water and a catalyst and stirred for a while, and thereafter these are reacted at room temperature or under heat to give a hydrolysate having an increased molecular weight.

The insulating layer-forming material as prepared in the manner mentioned above is applied onto a predetermined semiconductor substrate, such as a semiconductor substrate in the step that circuit elements and wiring patterns are formed on (e.g., a semiconductor substrate on which predetermined circuit elements such as IC circuits are formed and then aluminium wiring patterns are formed thereon), or a semiconductor substrate in the step that circuit elements are formed, or the like, then dried to remove the organic solvent, and thereafter cured under heat at 100° C. or higher to form an insulating layer on the substrate. In FIG. 1, 11 is an Si wafer having thereon a predetermined circuit element such as an IC element; 12 is an aluminium wiring pattern; 13 is a CVD-SiO$_2$ film (TEOS film); and 14 is an insulating layer containing a compound having an organic group. Preferably, the insulating layer is thicker than the wirings. For example, the thickness of the insulating layer is not smaller than 1.2 times that of the wirings.

The semiconductor substrate is not specifically defined, including, for example, Si wafer and GaAs wafer or the like. The coating method is not also specifically defined. For example, the coating liquid may be applied onto the substrate through spin coating, spraying, or dip coating. The drying temperature is not also specifically defined, but is preferably between 100° C. and 300° C. in order to promote the vaporization of the organic solvent. The thermal curing temperature is not also specifically defined, and may be 300° C. or higher. However, depending on the substrate to be used, the uppermost temperature for the curing is limited. For example, for the substrate having thereon an aluminium wiring, it is preferable that the insulating layer is formed through curing at a temperature not higher than 500° C. The thermal curing time is not also specifically defined. When the physical properties of the cured film have been mostly equilibrated, the heating is stopped. To determine the condition of the cured film for which the heating is stopped, there is no specific limitation. For example, preferred is a simple method of measuring the surface hardness and the thickness of the cured film formed or the like. The atmosphere for the thermal curing is not also specifically defined. Preferably, however, an inert gas such as nitrogen or argon is introduced into the curing system in order to minimize the removal of the alkyl group from the alkylalkoxysilane being heated.

The insulating layer thus formed on the predetermined semiconductor substrate, such as a semiconductor substrate at a stage where substrate circuit component element and wiring patterns are formed on it, or a semiconductor substrate at a stage where wiring patterns are formed on it, are polished with the cerium oxide slurry of the invention, whereby the uneven surface of the insulating layer is flattened and, after all, the entire surface of the resulting semiconductor device is flattened, as in FIG. 2.

As the polishing device, herein employable is any ordinary one which comprises a holder to hold a semiconductor substrate to be polished, and a surface plate with a pad of abrasive cloth attached thereto (the surface plate is provided with a motor or the like of which the number of revolution is variable). As the pad, ordinary nonwoven cloth, expanded polyurethane, porous fluorine resin etc. may be used and there is no special limitations. Preferably, the pad is worked to have grooves capable of keeping therein the slurry of the invention. The polishing condition is not specifically defined, but the surface plate is preferably rotated at a low rotating speed of not larger than 100 rpm in order that the semiconductor substrate being polished is not detached from the device. The pressure to be applied to the semiconductor substrate being polished is preferably not larger than 1 kg/cm$^2$ in order that the polished surface of semiconductor substrate is not scratched. During the polishing operation, the slurry is continuously fed to the pad using a pump or the like. The amount of the slurry to be fed is not specifically defined, but it is desirable that the surface of the pad is always covered with the slurry. For this, especially preferably, the amount of the slurry to be fed to the unit area of the surface plate is, for example, not smaller than 25 ml/min for a 18-inch surface plate. If the amount is smaller than 25 ml/min in that case, the substrate could not be polished to a sufficient degree of polishing speed. If so, in addition, the slurry is insufficiently dispersed so that the substrate could not be polished uniformly. Moreover, if so, the substrate is too greatly influenced by mechanical polishing with the pad, resulting in that the CVD film on the substrate will be greatly polished, so that the selectivity of the slurry abrasive of the invention, which is represented by the ratio of the polishing speed for the organic SOG film to that for the CVD film, is lowered, and therefore the intended selective polishing with the slurry abrasive could not be attained.

After having been thus polished, the semiconductor substrate is well washed with running water. Next, in order to remove the cerium oxide grains still adhering onto the surface of the substrate, the substrate is dipped in a liquid comprising (a) hydrogen peroxide, and (b) at least one selected from nitric acid, sulfuric acid, ammonium carbonate, ammonium carbamate and ammonium hydrogencarbonate, and thereafter again washed with water, and then dried. A mixture of two or more different liquids each comprising (a) and (b) may be used, if desired.

The dipping time is not specifically defined, and the dipping treatment may be finished after the bubbles to be formed as a result of the dissolution of the remaining cerium oxide grains are no more formed. The dipping temperature is not also specifically defined. However, when aqueous hydrogen peroxide or the like that has self-decomposability is used, the dipping therein is effected preferably at a temperature not higher than 40° C. After the final washing with water, it is desirable that water drops adhering onto the semiconductor substrate are removed, using a spin drier or the like, and thereafter the substrate is dried.

Over the thus-flattened insulating layer, a second aluminium wiring layer is formed, and an additional insulating layer is formed in the space with no wirings and on the wirings to thereby entirely cover the surface of the wirings, in the same manner as previously. Then, the insulating layer thus formed is polished with the cerium oxide slurry of the invention in the same manner as previously to flatten the uneven surface of the insulating layer, thereby after all flattening the entire surface of the resulting semiconductor substrate. This stop is repeated predetermined times to finally obtain the intended semiconductor chips.

Using the cerium oxide abrasive of the invention, silicone-free, organic polymer resin layers formed on substrates, for example, on semiconductor substrates can be polished.

The silicon-free, organic polymer resins include, for example, thermosetting resins such as phenolic resins, epoxy resins, unsaturated polyesters, polyesters, polyimides, and polyamidimides; and thermoplastic resins such as polyamides, polyurethanes, polyethylenes, ethylene-vinyl acetate copolymers, polypropylenes, polystyrenes, ABS resins, AS resins, polymethyl methacrylates, polyvinyl chlorides, polyvinyl formals, polytetrafluoroethylenes, and polytrifluorochloroethylenes. Of those, preferred are fluorine resins such as polytetrafluoroethylenes and polytrifluorochloroethylenes, since the substrates having thereon the films of those resins may have a lowered dielectric constant. Also preferred are polyamidimide resins and polyimide resins, since the films of those resins have good heat resistance. However, the resins for the films to be polished with the abrasive of the invention are not specifically defined.

The insulating layer-forming material comprising such a silicon-free, organic polymer resin may be prepared as follows: Where the material comprising a thermosetting resin is prepared, monomers and/or low-molecular-weight polymers for the resin are dissolved in an organic solvent such as an alcohol or the like mentioned above to form a coating liquid for the intended insulating layer. In order to enhance the curability of the layer to be formed, any ordinary curing agent, curing promoter and catalyst may be added to the coating liquid. Where the material comprising a thermoplastic resin is prepared, the resin is dissolved in an organic solvent such as an alcohol or the like mentioned above to form a coating liquid for the intended insulating layer. Preferably, 10 parts by weight of the organic polymer resin is combined with from 0 to 900 parts by weight of the organic solvent. If the amount of the organic solvent is over 900 parts by weight, the coating liquid could hardly form the intended insulating layer film.

Using the cerium oxide abrasive of the invention, at least one of two or more kinds of insulating layers different in material from one another formed on a substrate, for example, on a semiconductor substrate can be selectively polished.

Preferably, those two or more kind of insulating layers comprise an insulating layer as formed by applying a coating liquid, which is formed by hydrolyzing an alkoxysilane and an alkylalkoxysilane in the presence of water and a catalyst in an organic solvent, onto a substrate followed by curing it under heat; and an insulating $SiO_2$ layer. With the cerium oxide abrasive of the invention, only the former insulating layer can be selectively polished.

The substrate on which such two or more kind of insulating layers different in material from one another are formed includes, for example, wiring boards having an insulating $SiO_2$ film or the like formed thereon; optical glass articles such as photomasks, lenses and prisms or the like; optical integrated circuits, photo-switching elements and optical wave guides composed of glass and crystalline materials; edges of optical fibers; optical single crystals such as scintillators or the like; solid laser single crystals; LED sapphire substrates for blue lasers; semiconductive single crystals of SiC, GaP, GaAs or the like; glass substrates for magnetic discs; and magnetic heads.

Where at least one of two or more kind of insulating layers different in material from one another formed on a substrates such as semiconductor substrates or the like is selectively polished with the cerium oxide abrasive of the invention, it is desirable that the ratio of the polishing speed with the abrasive for the first insulating layer (for example, an insulating layer containing a compound having an organic group) to that therewith for the second insulating layer (for example, an insulating $SiO_2$ layer) is not smaller than 10. With the ratio within the defined range, the selective polishing of only the first insulating layer with the abrasive can be favorably attained.

FIG. 3 shows one embodiment of the semiconductor device of the invention, which has, on a support substrate, a semiconductor chip as produced by polishing its insulating film with the abrasive of the invention, and in which the semiconductor chip is encupslated with a sealant. The semiconductor device is not limited to only the lead-on-chip (LOC) type one, as in FIG. 3, but may be any other ordinary one including, for example, chip-on-lead (COL) type ones and even those with chips as mounted on a die pad. As the sealant, ordinary epoxy resin may be used. In FIG. 3, 1 is a bonding material; 2 is a semiconductor chip as produced by polishing its insulating film with the abrasive of the invention; 3 is a lead frame; 4 is a wire; and 5 is a sealant.

Using the abrasive of the invention, insulating films such as organic SOG films, organic polymer resin films or the like can be polished at a high speed without scratching the polished surfaces.

Where a substrate having therein a plurality of layers is polished according to the polishing method of the invention, the difference in surface level is almost completely removed throughout the entire surface of the polished substrate. Therefore, the polishing method of the invention is satisfactorily applied to any and every substrate having fine wirings thereon, by which, therefore, multi-layered wirings can be realized for high-density and large-scale integration circuits. In addition, since insulating films of organic SOG films or organic polymer resin films can be used, capability of filling the space between fine wiring lines and lowering of dielectric constant can be achieved at the same time.

BEST MODES OF CARRYING OUT THE INVENTION

Figure 1:
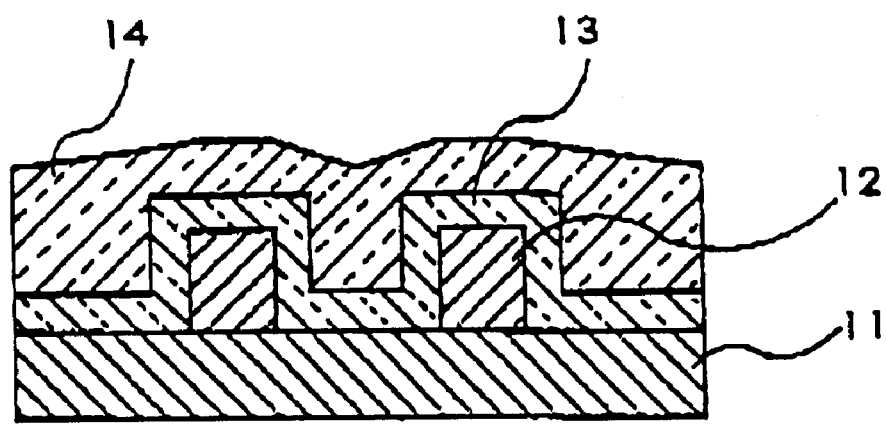
FIG. 1 is a cross-sectional view showing a semiconductor substrate, of which the Si wafer having thereon a circuit element, an aluminium wiring and a $CVD-SiO_2$ film is coated with an insulating layer containing a compound having an organic group.
Figure 2:
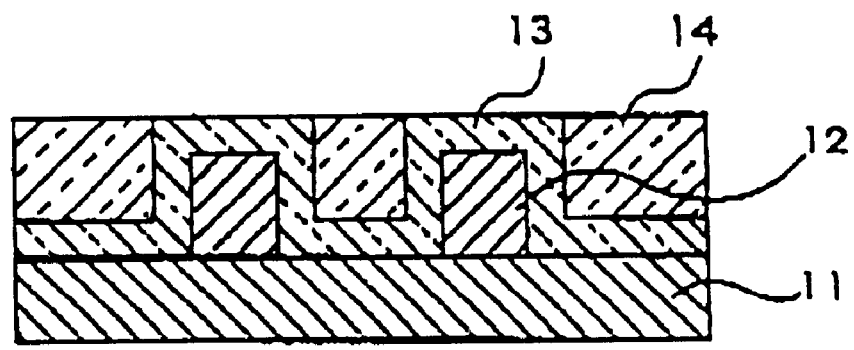
FIG. 2 is a cross-sectional view of the semiconductor substrate, in which the insulating layer has been polished.
Figure 3:
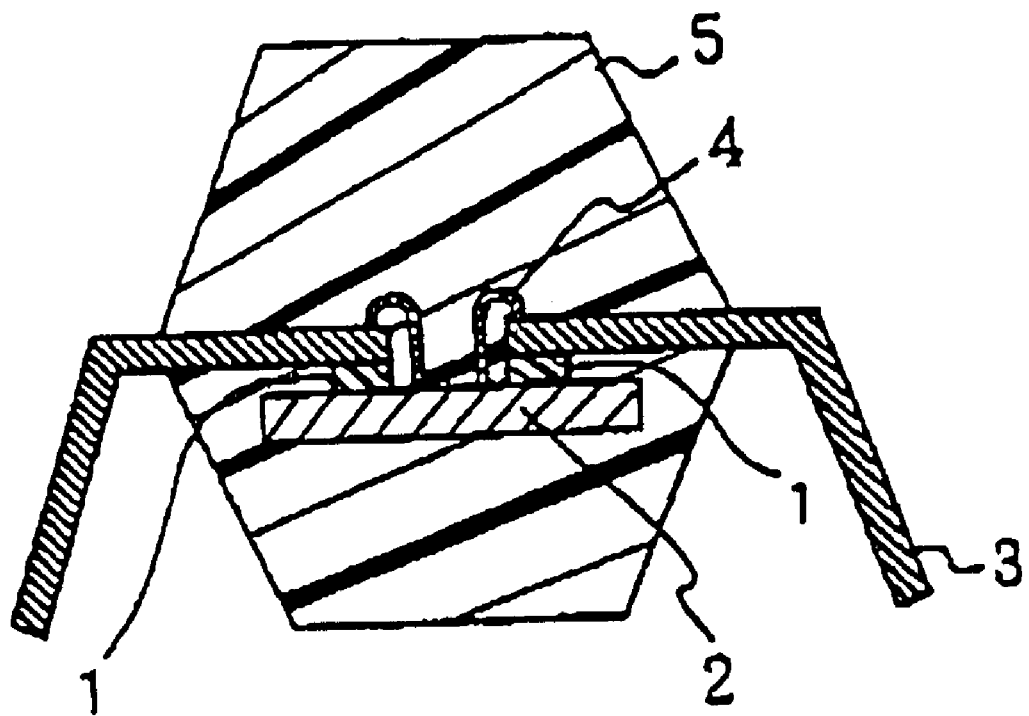
FIG. 3 is a cross-sectional view showing a semiconductor device which has a semiconductor chip as produced by polishing its insulating film with the abrasive of the invention mounted on a support substrate.

Now, various examples of the invention are mentioned below.

EXAMPLE 1

Formation of Cerium Oxide Grains, 1-1

50 g of cerium carbonate was added to 450 g of deionized water, and dispersed therein with a planetary ball mill at 2800 rpm for 15 minutes to obtain a white, cerium carbonate slurry. With stirring the slurry, 29.2 g of aqueous hydrogen peroxide (about 35%) was dropwise added thereto, reacted for 1 hour with further stirring, and thereafter heated up to 90° C. in a water bath. After having been still stirred for 1 hour at 90° C., this was cooled to room temperature, separated solid from liquid by a centrifuger, and then dried in a drier at 120° C. for 24 hours to obtain 30 g of a white powder. From its X-ray diffraction pattern, this white powder was identified as cerium oxide.

Formation of Cerium Oxide Grains, 1-2

Fifty grams of cerium nitrate was added to 500 g of deionized water, and well mixed. Then, with stirring the resulting mixture, an aqueous solution as prepared by dissolving 75 g of ammonium hydrogencarbonate in 400 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger. This was again put into 500 g of deionized water and well dispersed therein. Then, 60.9 g of aqueous hydrogen peroxide (about 35%) was dropwlse added to the resulting dispersion and reacted for 1 hour with still stirring it. Next, this was heated up to 90° C. in a water bath. After having been still stirred for 1 hour at 90° C., this was cooled to room temperature, separated the solid from separation by a centrifuger, and then dried in a drier at 120° C. for 24 hours to obtain 20 g of a white powder. From its X-ray diffraction pattern, this white powder was identified as cerium oxide.

Formation of Cerium Oxide Grains, 1-3

Fifty grams of cerium ammonium nitrate was added to 500 g of deionized water, and well mixed. With stirring the resulting mixture, an aqueous solution as prepared by dissolving 27 g of aqueous ammonia in 500 g of distilled water was dropwise added thereto (pH 10), and reacted as they were for 1 hour at room temperature to give a white precipitate. This white precipitate was separated through centrifugation at 3000 rpm for 10 minutes for solid-liquid separation, and then dried in a drier at 120° C. for 24 hours to obtain 15 g of a white powder. From its X-ray diffraction pattern, this white powder was identified as cerium oxide.

Formation of Cerium Oxide Slurries

Ten grams of each of those three cerium oxide powders was dispersed in 100 g of deionized water, to which was added 1 g of ammonium polyacrylate, and dispersed with a planetary ball mill (P-5 Model, manufactured by Flitche) at 2800 rpm for 30 minutes. Thus were obtained three milky white cerium oxide slurries. Using a Coulter counter (N-4 Model, manufactured by Nikka-ki), the grain size distribution of each slurry was measured. It was found that the mean grain size of the grains in each slurry was small to be 176 nm, and that each slurry was a mono-dispersed one having a relatively narrow grain size distribution.

Formation of Insulating Layer

A 4-inch Si wafer having thereon an IC circuit and an aluminium wiring in that order was set in a spin coater, onto which was applied 5 ml of a coating liquid that had been prepared by hydrolyzing tetramethoxysilane (4 mols) and methyltrimethoxysilane (1 mol) with water and nitric acid in isopropyl alcohol, Then, this was rotated at 2,500 rpm for 30 seconds, and dried on a hot plate at 250° C. for 1 minute. This wafer was set in a heating furnace and baked therein at 450° C. for 30 minutes to thereby form an insulating layer thereon.

Polishing of Insulating Layer

The Si wafer having the insulating layer formed thereon was set on a holder provided with a suction pad, via which the Si wafer was held by the holder, and the holder was set on a surface plate having an abrasive pad of a porous fluorine resin attached thereto (the surface plate was provided with a motor or the like of which the number of revolution is variable), with the side of the Si wafer being facedown. A weight of 5 kg was put on the holder. In that condition, the surface plate was rotated at 50 rpm for 4 minutes, while each of the three cerium oxide slurries prepared above was dropped thereonto, whereby the insulating film existing on the Si wafer was polished. After having been thus polished, the Si wafer was released from the holder, then well washed with running water, and thereafter put into a beaker filled with nitric acid. This beaker was set in an ultrasonic washer, in which the Si wafer was washed for 10 minutes. After having confirmed that the bubbling resulting from the dissolution of cerium oxide stopped, the Si wafer was taken out of the beaker, water drops existing on its surface were removed with a spin drier, and thereafter the Si wafer thus processed was dried in a drier at 120° C. for 10 minutes. Using an automatic ellipsometer, the change in the film thickness of the Si wafer before and after polishing it was determined, which verified that about 4,000 Å of the insulating layer of the Si wafer was cut off through the polishing, resulting in that the thickness of the thus-polished insulating layer was almost completely unified throughout the entire surface of the Si wafer. The thus-polished Si wafer was cut, and its cross section was observed with SEM, which verified that the insulating layer well covered the Si wafer with no defects such as empty pores even in the grooves between the wiring lines having a width of 0.1 $\mu$m and a depth of 1.0 $\mu$m. This process was repeated 6 times in all to form a 6-layered wiring pattern on the Si wafer, of which the cross section was observed with SEM. The SEM observation verified that there was almost no difference in surface level in each layer throughout the entire surface of the Si wafer substrate and that the wiring patterns formed were all good and accurate.

Comparative Example 1

In the same manner as in Example 1, an insulating film layer was formed on a semiconductor substrate. Without using the cerium oxide slurry herein, tried was the formation of multi-layered wiring on the substrate. However, in the samples prepared herein to have wirings of 3 or more layers, the difference in surface level was so great that the adjacent upper and lower layers could not ensure the insulating performance therebetween. It was found that multi-layered wirings of 3 or more layers could not be formed in this Comparative Example 1.

On the other hand, the insulating film layer formed herein was polished with a colloidal silica slurry with aqueous ammonia (SS-225, trade name of Cabot). In this, however, only about 400 Å of the layer was polished at 50 rpm for 10 minutes. Thus, it was found that the performance of the colloidal silica slurry abrasive was very poor for flattening the entire surface of Si wafers.

EXAMPLE 2

Formation of Cerium Oxide Grains, 2-1

Fifty frams of cerium carbonate was added to 450 g of deionized water, and dispersed therein with a planetary ball mill at 2800 rpm for 15 minutes to obtain a white, cerium carbonate slurry. With stirring the slurry, 29.2 g of aqueous hydrogen peroxide (about 35%) was dropwise added thereto, reacted for 1 hour with further stirring, and thereafter heated up to 90° C. in a water bath. After having been still stirred for 1 hour at 90° C., this was cooled to room temperature, centrifuged for solid-liquid separation, and then dried in a drier at 120° C. for 24 hours to obtain 30 g of a white powder. From its X-ray diffraction pattern, this white powder was identified as cerium oxide. Its specific surface area was measured through nitrogen adsorption to be 111 $m^2/g$.

Formation of Cerium Oxide Grains, 2-2

Fifty grams of cerium nitrate was added to 500 g of deionized water, and well mixed. Then, with stirring the resulting mixture, an aqueous solution as prepared by dissolving 75 g of ammonium hydrogencarbonate in 400 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger. This was again put into 500 g of deionized water and well dispersed therein. Then, 60.9 g of aqueous hydrogen peroxide (about 35%) was dropwlse added to the resulting dispersion and reacted for 1 hour with still stirring it. Next, this was heated up to 90° C. in a water bath. After having been still stirred for 1 hour at 90° C., this was cooled to room temperature, separated for the solid from liquid by a centrifuger, and then dried in a drier at 120° C. for 24 hours to obtain 20 g of a, white powder. From its X-ray diffraction pattern, this white powder was identified as cerium oxide. Its specific surface area was measured through nitrogen adsorption to be 112 $m^2/g$.

Formation of Cerium Oxide Grains, 2-3

Fifty grams of cerium ammonium nitrate was added to 500 g of deionized water, and well mixed. With stirring the resulting mixture, an aqueous solution as prepared by dissolving 27 g of aqueous ammonia in 500 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger, and then dried in a drier at 120° C. for 24 hours to obtain 15 g of a white powder. From its X-ray diffraction pattern, this white powder was identified as cerium oxide. Its specific surface area Was measured through nitrogen adsorption to be 130 m$^2$/g.

Formation of Cerium Oxide Slurries

Ten grams of each of those three cerium oxide powders was dispersed in 100 g of deionized water, to which was added 1 g of ammonium polyacrylate, and dispersed with a planetary ball mill (P-5 Model, manufactured by Flitche) at 2800 rpm for 30 minutes. Thus were obtained three milky white cerium oxide slurries. Using a Coulter counter (N-4 Model, manufactured by Nikka-ki), the grain size distribution of each slurry was measured. It was found that the mean grain size of the grains in each slurry was small to be 176 nm, and that each slurry was a mono-dispersed one having a relatively narrow grain size distribution.

Formation of Insulating Layer

A 4-inch Si wafer having thereon an IC circuit and an aluminium wiring in that order was processed in the same manner as in Example 1 to form an insulating layer thereon.

Polishing of Insulating Layer

Using any of the cerium oxide slurries prepared above, the insulating layer formed on the Si wafer was polished in the same manner as in Example 1. Using an automatic ellipsometer, the change in the film thickness of the Si wafer before and after polishing it was determined, which verified that about 4,000 Å of the insulating layer of the Si wafer was cut off through the polishing, resulting in that the thickness of the thus-polished insulating layer was almost completely unified throughout the entire surface of the Si wafer. The thus-polished Si wafer was cut, and its cross section was observed with SEM, which verified that the insulating layer well covered the Si wafer with no defects such as empty pores even in the grooves between the wiring lines having a width of 0.1 μm and a depth of 1.0 μm. This process was repeated 6 times in all to form a 6-layered wiring on the Si wafer, of which the cross section was observed with SEM. The SEM observation verified that there was almost no difference in surface level in each layer throughout the entire surface of the Si wafer substrate and that the wiring patterns formed were all good and accurate.

Comparative Example 2

In the same manner as in Example 2, an insulating film layer was formed on a semiconductor substrate. Without using the cerium oxide slurry herein, tried was the formation of multi-layered wirings on the substrate. However, in the samples prepared herein to have wirings of 3 or more layers, the difference in surface level was so great that the adjacent upper and lower layers could not ensure the insulating performance therebetween. It was found that multi-layered wirings of 3 or more layers could not be formed in this Comparative Example 2.

On the other hand, polishing of the insulating film layer same as mentioned above was tried with a slurry prepared in the same manner as mentioned above using a commercially-available cerium oxide grains having a specific surface area of 4 m$^2$/g. As a result, about 4,100 Å of the insulating layer was cut off, which was almost the same as that cut off in Example 2, but the surface of the insulating layer polished herein was much scratched. Then, the weight to the holder, which had been 5 kg, was reduced to 1 kg. Using the weight of 1 kg, the polished surface of the insulating layer was not scratched. In this condition, however, only about 1000 Å of the layer was cut off even after having been polished at 50 rpm for 10 minutes. Thus, it was found that the performance of this slurry was very poor for flattening the entire surface of Si wafers.

EXAMPLE 3

Formation of Cerium Oxide Grains, 3-1

Fifty grams of cerium carbonate was added to 450 g of deionized water, and dispersed therein with a planetary ball mill at 2800 rpm for 15 minutes to obtain a white, cerium carbonate slurry. With stirring the slurry, 29.2 g of aqueous hydrogen peroxide (about 35%) was dropwise added thereto, reacted for 1 hour with further stirring, and thereafter heated up to 90° C. in a water bath. After having been still stirred for 1 hour at 90° C., this was cooled to room temperature, separated the solid from liquid by a centrifuger, and then dried in a drier at 120° C. for 24 hours to obtain 30 g of a white powder. From its X-ray diffraction pattern, this white powder was identified as cerium oxide. Its apparent density as measured in a still standing method was 1.07 g/ml.

Formation of Cerium Oxide Grains, 3-2

Fifty grams of cerium nitrate was added to 500 g of deionized water, and well mixed. Then, with stirring the resulting mixture, an aqueous solution as prepared by dissolving 75 g of ammonium hydrogencarbonate in 400 g of distilled water was dropwise added thereto, and reacted as they were for 1 hour at room temperature to give a white precipitate. This white precipitate was separated through centrifugation at 3000 rpm for 10 minutes for solid-liquid separation by a contrifuger. This was again put into 500 g of deionized water and well dispersed therein. Then, 60.9 g of aqueous hydrogen peroxide (about 35%) was dropwlse added to the resulting dispersion and reacted for 1 hour with still stirring it. Next, this was heated up to 90° C. in a water bath. After having been still stirred for 1 hour at 90° C., this was cooled to room temperature, separated the solid from liquid by a centrifuger, and then dried in a drier at 120° C. for 24 hours to obtain 20 g of a white powder. From its X-ray diffraction pattern, this white powder was identified as cerium oxide. Its apparent density as measured in a still standing method was 1.11 g/ml.

Formation of Cerium Oxide Grains, 3-3

Fifty grams of cerium ammonium nitrate was added to 500 g of deionized water, and well mixed. With stirring the resulting mixture, an aqueous solution as prepared by dissolving 27 g of aqueous ammonia in 500 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger, and then dried in a drier at 120° C. for 24 hours to obtain 15 g of a white powder. From its X-ray diffraction pattern, this white powder was identified as cerium oxide. Its apparent density as measured in a still standing method was 1.08 g/ml.

Formation of Cerium Oxide Slurries

Ten grams of each of those three cerium oxide powders was dispersed in 100 g of deionized water, to which was added 1 g of ammonium polyacrylate, and dispersed with a planetary ball mill (P-5 Model, manufactured by FLITCHE) at 2800 rpm for 30 minutes. Thus were obtained three milky white cerium oxide slurries. Using a Coulter counter (N-4 Model, manufactured by Nikka-ki), the grain size distribution of each slurry was measured. It was found that the mean grain size of the grains in each slurry was small to be 176 nm, and that each slurry was a mono-dispersed one having a relatively narrow grain size distribution.

Formation of Insulating Layer

A 4-inch Si wafer having thereon an IC circuit and an aluminium wiring in that order was processed in the same manner as in Example 1 to form an insulating layer thereon.

Polishing of Insulating Layer

Using any of the cerium oxide slurries prepared above, the insulating layer formed on the Si wafer was polished in the same manner as in Example 1. Using an automatic ellipsometer, the change in the film thickness of the Si wafer before and after polishing it was determined, which verified that about 4,000 Å of the insulating layer of the Si wafer was cut off through the polishing, resulting in that the thickness of the thus-polished insulating layer was almost completely unified throughout the entire surface of the Si wafer. The thus-polished Si wafer was cut, and its cross section was observed with SEM, which verified that the insulating layer well covered the Si wafer with no defects such as empty pores even in the grooves between the wiring lines having a width of 0.1 $\mu$m and a depth of 1.0 $\mu$m. This process was repeated 6 times in all to form a 6-layered wiring on the Si wafer, of which the cross section was observed with SEM. The SEM observation verified that there was almost no difference in surface level in each layer throughout the entire surface of the Si wafer substrate and that the wiring patterns formed were all good and accurate.

Comparative Example 3

In the same manner as in Example 3, an insulating film layer was formed on a semiconductor substrate. Without using the cerium oxide slurry heroin, tried was the formation of multi-layered wirings on the substrate. However, in the samples prepared heroin to have wirings of 3 or more layers, the difference in surface level was so great that the adjacent upper and lower layers could not ensure the insulating performance therebetween. It was found that multi-layered wirings of 3 or more layers could not be formed in this Comparative Example 3.

On the other hand, polishing of the insulating film layer same as mentioned above was tried with a slurry prepared in the same manner as mentioned above using a commercially-available cerium oxide grains having an apparent density as measured in a still standing method of 1.33 g/ml. As a result, about 4,100 Å of the insulating layer was cut off, which was almost the same as that cut off in Example 3, but the surface of the insulating layer polished herein was much scratched. Then, the weight to the holder, which had been 5 kg, was reduced to 1 kg. Using the weight of 1 kg, the polished surface of the insulating layer was not scratched. In this condition, however, only about 1000 Å of the layer was cut off even after having been polished at 50 rpm for 10 minutes. Thus, it was found that the performance of this slurry was very poor for flattening the entire surface of Si wafers.

EXAMPLE 4

Formation of Cerium Oxide Grains, 4-1

Fifty grams of cerium carbonate was added to 450 g of deionized water, and dispersed therein with a planetary ball mill at 2800 rpm for 15 minutes to obtain a white, cerium carbonate slurry. With stirring the slurry, 29.2 g of aqueous hydrogen peroxide (about 35%) was dropwise added thereto, reacted for 1 hour with further stirring, and thereafter heated up to 90° C. in a water bath. After having been still stirred for 1 hour at 90° C., this was cooled to room temperature, separated the solid from liquid by a centrifuger, and then dried in a drier at 120° C. for 24 hours to obtain 30 g of a white powder. From its X-ray diffraction pattern, this white powder was identified as cerium oxide. Its apparent density as measured in a tapping method was 1.43 g/ml.

Formation of Cerium Oxide Grains, 4-2

Fifty grams of cerium nitrate was added to 500 g of deionized water, and well mixed. Then, with stirring the resulting mixture, an aqueous solution as prepared by dissolving 75 g of ammonium hydrogencarbonate in 400 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger. This was again put into 500 g of deionized water and well dispersed therein. Then, 60.9 g of aqueous hydrogen peroxide (about 35%) was dropwise added to the resulting dispersion and reacted for 1 hour with still stirring it. Next, this was heated up to 90° C. in a water bath. After having been still stirred for 1 hour at 90° C., this was cooled to room temperature, separated the solid from liquid by a centrifuger, and then dried in a drier at 120° C. for 24 hours to obtain 20 g of a white powder. From its X-ray diffraction pattern, this white powder was identified as cerium oxide. Its apparent density as measured in a tapping method was 1.52 g/ml.

Formation of Cerium Oxide Grains, 4-3

Fifty grams of cerium ammonium nitrate was added to 500 g of deionized water, and well mixed. With stirring the resulting mixture, an aqueous solution as prepared by dissolving 27 g of aqueous ammonia in 500 g of distilled water was dropwise added thereto, and reacted as they were for 1 hour at room temperature to give a white precipitate. This white precipitate was separated through centrifugation at 3000 rpm for 10 minutes for solid-liquid separation by a contrifuger, and then dried in a drier at 120° C. for 24 hours to obtain 15 g of a white powder. From its X-ray diffraction pattern, this white powder was identified as cerium oxide. Its apparent density as measured in a tapping method was 1.49 g/ml.

Formation of Cerium Oxide Slurries

Ten grams of each of those three cerium oxide powders was dispersed in 100 g of deionized water, to which was added 1 g of ammonium polyacrylate, and dispersed with a planetary ball mill (P-5 Model, manufactured by Flitche) at 2800 rpm for 30 minutes. Thus were obtained three milky white cerium oxide slurries. Using a Coulter counter (N-4 Model, manufactured by Nikka-ki), the grain size distribution of each slurry was measured. It was found that the mean grain size of the grains in each slurry was small to be 176 nm, and that each slurry was a mono-dispersed one having a relatively narrow grain size distribution.

Formation of Insulating Layer

A 4-inch Si wafer having thereon an IC circuit and an aluminium wiring pattern in that order was processed in the same manner as in Example 1 to form an insulating layer thereon.

Polishing of Insulating Layer

Using any of the cerium oxide slurries prepared above, the insulating layer formed on the Si wafer was polished in the same manner as in Example 1. Using an automatic ellipsometer, the change in the film thickness of the Si wafer before and after polishing it was determined, which verified that about 4,000 Å of the insulating layer of the Si wafer was cut off through the polishing, resulting in that the thickness of the thus-polished insulating layer was almost completely unified throughout the entire surface of the Si wafer. The thus-polished Si wafer was cut, and its cross section was observed with SEM, which verified that the insulating layer well covered the Si wafer with no defects such as empty pores even in the grooves between the wiring lines having a width of 0.1 μm and a depth of 1.0 μm. This process was repeated 6 times in all to form a 6-layered wiring on the Si wafer, of which the cross section was observed with SEM. The SEM observation verified that there was almost no difference in surface level in each layer throughout the entire surface of the Si wafer substrate and that the wiring patterns formed were all good and accurate.

Comparative Example 4

In the same manner as in Example 4, an insulating film layer was formed on a semiconductor substrate. Without using the cerium oxide slurry herein, tried was the formation of multi-layered wirings on the substrate. However, in the samples prepared herein to have wirings of 3 or more layers, the difference in surface level was so great that the adjacent upper and lower layers could not ensure the insulating performance therebetween. It was found that multi-layered wirings of 3 or more layers could not be formed in this Comparative Example 4.

On the other hand, polishing of the insulating film layer same as mentioned above was tried with a slurry prepared in the same manner as mentioned above using a commercially-available cerium oxide grains having an apparent density as measured in a tapping method of 1.67 g/ml. As a result, about 4,100 Å of the insulating layer was cut off, which was almost the same as that cut off in Example 4, but the surface of the insulating layer polished herein was much scratched. Then, the weight to the holder, which had been 5 kg, was reduced to 1 kg. Using the weight of 1 kg, the polished surface of the insulating layer was not scratched. In this condition, however, only about 1000 Å of the layer was cut off even after having been polished at 50 rpm for 10 minutes. Thus, it was found that the performance of this slurry was very poor for flattening the entire surface of Si wafers.

EXAMPLE 5
Formation of Cerium Oxide Grains, 5.1

Fifty grams of cerium carbonate was added to 450 g of deionized water, and dispersed therein with a planetary ball mill at 2800 rpm for 15 minutes to obtain a white, cerium carbonate slurry. With stirring the slurry, 29.2 g of aqueous hydrogen peroxide (about 35%) was dropwlse added thereto, reacted for 1 hour with further stirring, and thereafter heated up to 90° C. in a water bath. After having been still stirred for 1 hour at 90° C., this was cooled to room temperature, separated the solid from liquid by centrifuger, and then dried in a drier at 120° C. for 24 hours to obtain 30 g of a white powder. From its X-ray diffraction pattern, this white powder was identified as cerium oxide. The half-value width of the main peak appearing in the powdery X-ray diffraction pattern of this powder was measured to be 1.38°.
Formation of Cerium Oxide Grains, 5-2

Fifty grams of cerium nitrate was added to 500 g of deionized water, and well mixed. Then, with stirring the resulting mixture, an aqueous solution as prepared by dissolving 75 g of ammonium hydrogencarbonate in 400 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger. This was again put into 500 g of deionized water and well dispersed therein. Then, 60.9 g of aqueous hydrogen peroxide (about 35%) was dropwlse added to the resulting dispersion and reacted for 1 hour with still stirring it. Next, this was heated up to 90° C. in a water bath. After having been still stirred for 1 hour at 90° C., this was cooled to room temperature, centrifuged for solid-liquid separation, and then dried in a drier at 120° C. for 24 hours to obtain 20 g of a white powder. From its X-ray diffraction pattern, this white powder was identified as cerium oxide. The half-value width of the main peak appearing in the powdery X-ray diffraction pattern of this powder was measured to be 1.30°.
Formation of Cerium Oxide Grains, 5-3

Fifty grams of cerium ammonium nitrate was added to 500 g of deionized water, and well mixed. With stirring the resulting mixture, an aqueous solution as prepared by dissolving 27 g of aqueous ammonia in 500 g of distilled water was dropwlse added thereto, and reacted as they were for 1 hour at room temperature to give a white precipitate. This white precipitate was separated through centrifugation at 3000 rpm for 10 minutes for solid-liquid separation by a centrifuger, and then dried in a drier at 120° C. for 24 hours to obtain 15 g of a white powder. From its X-ray diffraction pattern, this white powder was Identified as cerium oxide. The half-value width of the main peak appearing in the powdery X-ray diffraction pattern of this powder was measured to be 1.44°.
Formation of Cerium Oxide Slurries Ten grams of each of those three cerium oxide powders was dispersed in 100 g of deionized water, to which was added 1 g of ammonium polyacrylate, and dispersed with a planetary ball mill (P-5 Model, manufactured by Flitche) at 2800 rpm for 30 minutes. Thus were obtained three milky white cerium oxide slurries. Using a Coulter counter (N-4 Model, manufactured by Nikka-ki), the grain size distribution of each slurry was measured. It was found that the mean grain size of the grains in each slurry was small to be 176 nm, and that each slurry was a mono-dispersed one having a relatively narrow grain size distribution.
Formation of Insulating Layer A 4-inch Si wafer having thereon an IC circuit and an aluminium wiring pattern in that order was processed in the same manner as in Example 1 to form an insulating layer thereon.
Polishing of Insulating Layer Using any of the cerium oxide slurries prepared above, the insulating layer formed on the Si wafer was polished in the same manner as in Example 1. Using an automatic ellipsometer, the change in the film thickness of the Si wafer before and after polishing it was determined, which verified that about 4,000 Å of the insulating layer of the Si wafer was cut off through the polishing, resulting in that the thickness of the thus-polished insulating layer was almost completely unified throughout the entire surface of the Si wafer. The thus-polished Si wafer was cut, and its cross section was observed with SEM, which verified that the insulating layer well covered the Si wafer with no defects such as empty pores even in the grooves between the wiring lines having a width of 0.1 μm and a depth of 1.0 μ. This process was repeated 6 times in all to form a 6-layered wiring on the Si wafer, of which the cross section was observed with SEM. The SEM observation verified that there was almost no difference in surface level in each layer throughout the entire surface of the Si wafer substrate and that the wiring patterns formed were all good and accurate.

Under the same condition, the CVD film (of $SiO_2$) formed on the Si wafer was polished, resulting in that only about 200 Å of the film was cut off. In this, the ratio of the polishing speed for the organic SOG film to that for the CVD film was about 20, from which it was confirmed that only the SOG film was well selectively polished with the abrasive used herein.

Comparative Example 5

In the same manner as in Example 5, an insulating film layer was formed on a semiconductor substrate. Without using the cerium oxide slurry herein, tried was the formation of multi-layered wirings on the substrate. However, in the samples prepared herein to have wirings of 3 or more layers, the difference in surface level was so great that the adjacent upper and lower layers could not ensure the insulating performance therebetween. It was found that multi-layered wirings of 3 or more layers could not be formed in this Comparative Example 5.

On the other hand, polishing of the insulating film layer same as mentioned above was tried with a slurry prepared in the same manner as mentioned above using a commercially-available cerium oxide grains, of which the powdery X-ray diffraction pattern gave a main peak having a half-value width of 0.25°. As a result, about 4,100 Å of the organic SOG film layer was cut off, which was almost the same as that cut off in Example 5, but, about 4000 Å of the CVD film formed on the substrate was also cut off. Thus, using this slurry, it was found impossible to selectively polish only the organic SOG film. In addition, both the organic SOG film and the CVD film as polished were much scratched. Then, the weight to the holder, which had been 5 kg, was reduced to 1 kg. Using the weight of 1 kg, the polished surfaces of the layers were not scratched. In this condition, however, only about 1000 Å of the layers was cut off even after having been polished at 50 rpm for 10 minutes. Thus, it was found that the performance of this slurry was very poor for flattening the entire surface of Si wafers.

EXAMPLE 6

Formation of Cerium Oxide Grains, 6-1

50 g of cerium carbonate was added to 450 g of deionized water, and dispersed therein with a planetary ball mill at 2800 rpm for 15 minutes to obtain a white, cerium carbonate slurry. With stirring the slurry, 29.2 g of aqueous hydrogen peroxide (about 35%) was dropwise added thereto, reacted for 1 hour with further stirring, and thereafter heated up to 90° C. in a water bath. After having been still stirred for 1 hour at 90° C., this was cooled to room temperature, centrifuged for solid-liquid separation, and then dried in a drier at 120° C. for 24 hours to obtain 30 g of a white powder. From its X-ray diffraction pattern, this white powder was identified as cerium oxide. The size of the primary grain in the powder was measured through transmitting electromicroscopic observation to be from about 5 to about 10 nm.

Formation of Cerium Oxide Grains, 6-2

Fifty grams of cerium nitrate was added to 500 g of deionized water, and well mixed. Then, with stirring the resulting mixture, an aqueous solution as prepared by dissolving 75 g of ammonium hydrogencarbonate in 400 g of distilled water was dropwlse added thereto, and reacted as they were for 1 hour at room temperature to give a white precipitate. This white precipitate was separated through centrifugation at 3000 rpm for 10 minutes for solid-liquid separation by a centrifuger. This was again put into 500 g of deionized water and well dispersed therein. Then, 60.9 g of aqueous hydrogen peroxide (about 35%) was dropwise added to the resulting dispersion and reacted for 1 hour with still stirring it. Next, this was heated up to 90° C. in a water bath. After having been still stirred for 1 hour at 90° C., this was cooled to room temperature, separated the solid from liquid by a centrifuger, and then dried in a drier at 120° C. for 24 hours to obtain 20 g of a white powder. From its X-ray diffraction pattern, this white powder was identified as cerium oxide. The size of the primary grain in the powder was measured through transmitting electromicroscopic observation to be from about 2 to about 5 nm.

Formation of Cerium Oxide Grains, 6-3

Fifty grams of cerium ammonium nitrate was added to 500 g of deionized water, and well mixed. With stirring the resulting mixture, an aqueous solution as prepared by dissolving 27 g of aqueous ammonia in 500 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger, and then dried in a drier at 120° C. for 24 hours to obtain 15 g of a white powder. From its X-ray diffraction pattern, this white powder was identified as cerium oxide. The size of the primary grain in the powder was measured through transmitting electromicroscopic observation to be from about 5 to about 10 nm.

Formation of Cerium Oxide Slurries

Ten grams of each of those three cerium oxide powders was dispersed in 100 g of deionized water, to which was added 1 g of ammonium polyacrylate, and dispersed with a planetary ball mill (P-5 Model, manufactured by Flitche) at 2800 rpm for 30 minutes. Thus were obtained three milky white cerium oxide slurries. Using a Coulter counter (N-4 Model, manufactured by Nikka-ki), the grain size distribution of each slurry was measured. It was found that the mean grain size of the grains in each slurry was small to be 176 nm, and that each slurry was a mono-dispersed one having a relatively narrow grain size distribution.

Formation of Insulating Layer

A 4-inch Si wafer having thereon an IC circuit and an aluminium wiring pattern in that order was processed in the same manner as in Example 1 to form an insulating layer thereon.

Polishing of Insulating Layer

Using any of the cerium oxide slurries prepared above, the insulating layer formed on the Si wafer was polished in the same manner as in Example 1. Using an automatic ellipsometer, the change in the film thickness of the Si wafer before and after polishing it was determined, which verified that about 4,000 Å of the insulating layer of the Si wafer was cut off through the polishing, resulting in that the thickness of the thus-polished insulating layer was almost completely unified throughout the entire surface of the Si wafer. The thus-polished Si wafer was cut, and its cross section was observed with SEM, which verified that the insulating layer well covered the Si wafer with no defects such as empty pores even in the grooves between the wiring lines having. a width of 0.1 $\mu$m and a depth of 1.0 $\mu$m. This process was repeated 6 times in all to form a 6-layered wiring on the Si wafer, of which the cross section was observed with SEM. The SEM observation verified that there was almost no difference in surface level in each layer throughout the entire surface of the Si wafer substrate and that the wiring patterns formed were all good and accurate.

Comparative Example 6

In the same manner as in Example 6, an insulating film layer was formed on a semiconductor substrate. Without using the, cerium oxide slurry herein, tried was the formation of multi-layered wirings on the substrate. However, in the samples prepared herein to have wirings of 3 or more layers, the difference in surface level was so great that the adjacent upper and lower layers could not ensure the insulating performance therebetween. It was found that multi-layered wirings of 3 or more layers could not be formed in this Comparative Example 6.

On the other hand, polishing of the insulating film layer same as mentioned above was tried with a slurry prepared in the same manner as mentioned above using a commercially-available cerium oxide grains, of which the primary grains were found to have a primary grain size of about 50 nm through transmitting electromicroscopic observation. As a result, only about 2,000 Å of the insulating layer was cut off through the polishing and, in addition, the polished surface of the layer was much scratched, Then, the weight to the holder, which had been 5 kg, was reduced to 1 kg. Using the weight of 1 kg, the polished surface of the layer was not scratched. In this condition, however, only about 500 Å of the layer was cut off even after having been polished at 50 min for 10 minutes. Thus, it was found that the performance of this slurry was very poor for flattening the entire surface of Si wafers.

EXAMPLE 7

Formation of Cerium Oxide Grains, 7-1

Fifty grams of cerium carbonate was added to 450 g of deionized water, and dispersed therein with a planetary ball mill at 2800 rpm for 15 minutes to obtain a white, cerium carbonate slurry. With stirring the slurry, 29.2 g of aqueous hydrogen peroxide (about 35%) was dropwise added thereto, reacted for 1 hour with further stirring, and thereafter heated up to 90° C. in a water bath. After having been still stirred for 1 hour at 90° C., this was cooled to room temperature, centrifuged for solid-liquid separation, and then dried in a drier at 120° C. for 24 hours to obtain 30 g of a white powder. From its X-ray diffraction pattern, this white powder was identified as cerium oxide. The primary grain size in the powder was measured through transmitting electromicroscopic observation to be from about 5 to about 10 nm. Through scanning electromicroscopic observation, the secondary grain size in it was measured to be about 0.2 $\mu$m.

Formation of Cerium Oxide Grains, 7-2

Fifty frams of cerium nitrate was added to 500 g of deionized water, and well mixed. Then, with stirring the resulting mixture, an aqueous solution as prepared by dissolving 75 g of ammonium hydrogencarbonate in 400 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger. This was again put into 500 g of deionized water and well dispersed therein. Then, 60.9 g of aqueous hydrogen peroxide (about 35%) was dropwise added to the resulting dispersion and reacted for 1 hour with still stirring it. Next, this was heated up to 90° C. in a water bath. After having been still stirred for 1 hour at 90° C., this was cooled to room temperature, separated the solid from liquid by a centrifuger, and then dried in a drier at 120° C. for 24 hours to obtain 20 g of a white powder. From its X-ray diffraction pattern, this white powder was identified as cerium oxide. The size of the primary grain in the powder was measured through transmitting electromicroscopic observation to be from about 2 to about 5 nm. Through scanning electromicroscopic observation, the size of the secondary grain in it was measured to be from about 0.2 to about 0.3 $\mu$m.

Formation of Cerium Oxide Grains, 7-3

Fifty grams of cerium ammonium nitrate was added to 500 g of deionized water, and well mixed. With stirring the resulting mixture, an aqueous solution as prepared by dissolving 27 g of aqueous ammonia in 500 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger, and then dried in a drier at 120° C. for 24 hours to obtain 15 g of a white powder. From its X-ray diffraction pattern, this white powder was identified as cerium oxide. The size of the primary grain in the powder was measured through transmitting electromicroscopic observation to be from about 5 to about 10 nm. Through scanning electromicroscopic observation, the size of the secondary grain in it was measured to be from about 0.2 $\mu$m.

Formation of Cerium Oxide Slurries

Ten grams of each of those three cerium oxide powders was dispersed in 100 g of deionized water, to which was added 1 g of ammonium polyacrylate, and dispersed with a planetary ball mill (P-5 Model, manufactured by Flitche) at 2800 rpm for 30 minutes. Thus were obtained three milky white cerium oxide slurries. Using a Coulter counter (N-4 Model, manufactured by Nikka-ki), the grain size distribution of each slurry was measured. It was found that the mean grain size of the grains in each slurry was small to be 176 nm, and that each slurry was a mono-dispersed one having a relatively narrow grain size distribution.

Formation of Insulating Layer

A 4-inch Si wafer having thereon an IC circuit and an aluminium wiring pattern in that order was processed in the same manner as in Example 1 to form an insulating layer thereon.

Polishing of Insulating Layer

Using any of the cerium oxide slurries prepared above, the insulating layer formed on the Si wafer was polished in the same manner as in Example 1. Using an automatic ellipsometer, the change in the film thickness of the Si wafer before and after polishing it was determined, which verified that about 4,000 Å of the insulating layer of the Si wafer was cut off through the polishing, resulting in that the thickness of the thus-polished insulating layer was almost completely unified throughout the entire surface of the Si wafer. The thus-polished Si wafer was cut, and its cross section was observed with SEM, which verified that the insulating layer well covered the Si wafer with no defects such as empty pores even in the grooves between the wiring lines having a width of 0.1 $\mu$m and a depth of 1.0 $\mu$m. This process was repeated 6 times in all to form a 6-layered wiring pattern on the Si wafer, of which the cross section was observed with SEM. The SEM observation verified that there was almost no difference in surface level in each layer throughout the entire surface of the Si wafer substrate and that the wiring patterns formed were all good and accurate.

Comparative Example 7

In the same manner as in Example 7, an insulating film layer was formed on a semiconductor substrate. Without using the cerium oxide slurry herein, tried was the formation of multi-layered wirings, on the substrate. However, in the samples prepared heroin to have wirings of 3 or more layers, the difference in surface level was so great that the adjacent upper and lower layers could not ensure the insulating performance therebetween. It was found that multi-layered wirings of 3 or more layers could not be formed in this Comparative Example 7.

On the other hand, polishing of the insulating film layer same as mentioned above was tried with a slurry prepared in the same manner as mentioned above using a commercially-available cerium oxide grains, of which the primary grains and the secondary grains were found to have a primary grain size of about 50 nm and a secondary grain size of about 5.0 μm, respectively, through transmitting electromicroscopic observation and scanning electromicroscopic observation. As a result, only about 2,000 Å of the insulating layer was cut off through the polishing and, in addition, the polished surface of the layer was much scratched. Then, the weight to the holder, which had been 5 kg, was reduced to 1 kg. Using the weight of 1 kg, the polished surface of the layer was not scratched. In this condition, however, only about 500 Å of the layer was cut off even after having been polished at 50 rpm for 10 minutes. Thus, it was found that the performance of this slurry was very poor for flattening the entire surface of Si wafers.

EXAMPLE 8

Formation of Cerium Oxide Grains, 8-1

Fifty grams of cerium carbonate was added to 450 g of deionized water, and dispersed therein with a planetary ball mill at 2800 rpm for 15 minutes to obtain a white, cerium carbonate slurry. With stirring the slurry, 29.2 g of aqueous hydrogen peroxide (about 35%) was dropwise added thereto, reacted for 1 hour with further stirring, and thereafter heated up to 90° C. in a water bath. After having been still stirred for 1 hour at 90° C., this was cooled to room temperature, centrifuged for solid-liquid separation, and then dried in a drier at 120° C. for 24 hours to obtain 30 g of a white powder. From its X-ray diffraction pattern, this white powder was Identified as cerium oxide. The size of the secondary grain in the powder was measured through scanning electromicroscopic observation to be about 0.2 μm. In addition, it was found that the outline of each of those secondary grains had almost no sharp corners and was gently roundish.

Formation of Cerium Oxide Grains, 8-2

Fifty grams of cerium nitrate was added to 500 g of deionized water, and well mixed. Then, with stirring the resulting mixture, an aqueous solution as prepared by dissolving 75 g of ammonium hydrogencarbonate in 400 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger. This was again put into 500 g of deionized water and well dispersed therein. Then, 60.9 g of aqueous hydrogen peroxide (about 35%) was dropwise added to the resulting dispersion and reacted for 1 hour with still stirring it. Next, this was heated up to 90° C. in a water bath. After having been still stirred for 1 hour at 90° C., this was cooled to room temperature, separated the solid from liquid by a centrifuger, and then dried in a drier at 120° C. for 24 hours to obtain 20 g of a white powder. From its X-ray diffraction pattern, this white powder was identified as, cerium oxide. The size of the secondary grain in the powder was measured through scanning electromicroscopic observation to be from about 0.2 to about 0.3 μm. In addition, it was found that the outline of each of those secondary grains had almost no sharp corners and was gently roundish.

Formation of Cerium Oxide Grains, 8-3

Fifty grams of cerium ammonium nitrate was added to 500 g of deionized water, and well mixed. With stirring the resulting mixture, an aqueous solution as prepared by dissolving 27 g of aqueous ammonia in 500 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger, and then dried in a drier at 120° C. for 24 hours to obtain 15 g of a white powder. From its X-ray diffraction pattern, this white powder was identified as cerium oxide. The size of the secondary grain in the powder was measured through scanning electromicroscopic observation to be about 0.2 μm. In addition, it was found that the outline of each of those secondary grains had almost no sharp corners and was gently roundish.

Formation of Cerium Oxide Slurries

Ten grams of each of those three cerium oxide powders was dispersed in 100 g of deionized water, to which was added 1 g of ammonium polyacrylate, and dispersed with a planetary ball mill (P-5 Model, manufactured by Flitche) at 2800 rpm for 30 minutes. Thus were obtained three milky white cerium oxide slurries. Using a Coulter counter (N-4 Model, manufactured by Nikka-ki), the grain size distribution of each slurry was measured. It was found that the mean grain size of the grains in each slurry was small to be 176 nm, and that each slurry was a mono-dispersed one having a relatively narrow grain size distribution.

Formation of Insulating Layer

A 4-inch Si wafer having thereon an IC circuit and an aluminium wiring pattern in that order was processed in the same manner as in Example 1 to form an insulating layer thereon.

Polishing of Insulating Layer

Using any of the cerium oxide slurries prepared above, the insulating layer formed on the Si wafer was polished in the same manner as in Example 1. Using an automatic ellipsometer, the change in the film thickness of the Si wafer before and after polishing it was determined, which verified that about 4,000 Å of the insulating layer of the Si wafer was cut off through the polishing, resulting in that the thickness of the thus-polished insulating layer was almost completely unified throughout the entire surface of the Si wafer. The thus-polished Si wafer was cut, and its cross section was observed with SEM, which verified that the insulating layer well covered the Si wafer with no defects such as empty pores even in the grooves between the wiring lines having a width of 0.1 μm and a depth of 1.0 μm. This process was repeated 6 times in all to form a 6-layered wiring on the Si wafer, of which the cross section was observed with SEM. The SEM observation verified that there was almost no difference in surface level in each layer throughout the entire surface of the Si wafer substrate and that the wiring patterns formed were all good and accurate.

Comparative Example 8

In the same manner as in Example 8, an insulating film layer was formed on a semiconductor substrate. Without using the cerium oxide slurry herein, tried was the formation of multi-layered wirings, on the substrate. However, in the samples prepared herein to have wirings of 3 or more layers, the difference in surface level was so great that the adjacent upper and lower layers could not ensure the insulating performance therebetween. It was found that multi-layered wirings of 3 or more layers could not be formed in this Comparative Example 8.

On the other hand, polishing of the insulating film layer same as mentioned above was tried with a slurry prepared in the same manner as mentioned above using a commercially-available cerium oxide grains, of which the secondary grains were found to have a secondary grain size of about 1.0 μm through scanning electromicroscopic observation and in which the outline of each secondary grains was found to have edges having an angle falling between 60° and 110°. As a result, only about 2,100 Å of the insulating layer was cut off through the polishing and, in addition, the polished surface of the layer was much scratched. Then, the weight to the holder, which had been 5 kg, was reduced to 1 kg. Using the weight of 1 kg, the polished surface of the layer was not scratched. In this condition, however, only about 500 Å of the layer was cut off even after having been polished at 50 rpm for 10 minutes. Thus, it was found that the performance of this slurry was very poor for flattening the entire surface of Si wafers.

EXAMPLE 9

Formation of Cerium Oxide Grains, 9-1

Fifty grams of cerium carbonate was added to 450 g of deionized water, and dispersed therein with a planetary ball mill at 2800 rpm for 15 minutes to obtain a white, cerium carbonate slurry. With stirring the slurry, 29.2 g of aqueous hydrogen peroxide (about 35%) was dropwise added thereto, reacted for 1 hour with further stirring, and thereafter heated up to 90° C. in a water bath. After having been still stirred for 1 hour at 90° C., this was cooled to room temperature, centrifuged for solid-liquid separation, and then dried in a drier at 120° C. for 24 hours to obtain 30 g of a white powder. From its X-ray diffraction pattern, this white powder was identified as cerium oxide. The aspect ratio of the primary grains in the powder was measured through transmitting electromicroscopy to be 1.1.

Formation of Cerium Oxide Grains, 9-2

Fifty grams of cerium nitrate was added to 500 g of deionized water, and well mixed. Then, with stirring the resulting mixture, an aqueous solution as prepared by dissolving 75 g of ammonium hydrogencarbonate in 400 g of distilled water was dropwise added thereto, and reacted as they were for 1 hour at room temperature to give a white precipitate. This white precipitate was separated through centrifugation at 3000 rpm for 10 minutes for solid-liquid separation by a contrifuger. This was again put into 500 g of deionized water and well dispersed therein. Then, 60.9 g of aqueous hydrogen peroxide (about 35%) was dropwise added to the resulting dispersion and reacted for 1 hour with still stirring it. Next, this was heated up to 90° C. in a water bath. After having been still stirred for 1 hour at 90° C., this was cooled to room temperature, separated the solid from liquid by a centrifuger, and then dried in a drier at 120° C. for 24 hours to obtain 20 g of a white powder. From its X-ray diffraction pattern, this white powder was identified as cerium oxide. The aspect ratio of the primary grains in the powder was measured through transmitting electromicroscopy to be 1.4.

Formation of Cerium Oxide Grains, 9-3

Fifty grams of cerium ammonium nitrate was added to 500 g of deionized water, and well mixed. With stirring the resulting mixture, an aqueous solution as prepared by dissolving 27 g of aqueous ammonia in 500 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger, and then dried in a drier at 120° C. for 24 hours to obtain 15 g of a white powder. From its X-ray diffraction pattern, this white powder was identified as cerium oxide. The aspect ratio of the primary grains in the powder was measured through transmitting electromicroscopy to be 1.2.

Formation of Cerium Oxide Slurries

Ten grams of each of those three cerium oxide powders was dispersed in 100 g of deionized water, to which was added 1 g of ammonium polyacrylate, and dispersed with a planetary ball mill (P-5 Model, manufactured by Flitche) at 2800 rpm for 30 minutes. Thus were obtained three milky white cerium oxide slurries. Using a Coulter counter (N-4 Model, manufactured by Nikka-ki), the grain size distribution of each slurry was measured. It was found that the mean grain size of the grains in each slurry was small to be 176 nm, and that each slurry was a mono-dispersed one having a relatively narrow grain size distribution.

Formation of Insulating Layer

A 4-inch Si wafer having thereon an IC circuit and an aluminium wiring pattern in that order was processed in the same manner as in Example 1 to form an insulating layer thereon.

Polishing of Insulating Layer

Using any of the cerium oxide slurries prepared above, the insulating layer formed on the Si wafer was polished in the same manner as in Example 1. Using an automatic ellipsometer, the change in the film thickness of the Si wafer before and after polishing it was determined, which verified that about 4,000 Å of the insulating layer of the Si wafer was cut off through the polishing, resulting in that the thickness of the thus-polished insulating layer was almost completely unified throughout the entire surface of the Si wafer. The thus-polished Si wafer was cut, and its cross section was observed with SEM, which verified that the insulating layer well covered the Si wafer with no defects such as empty pores even in the grooves between the wiring lines having a width of 0.1 $\mu$m and a depth of 1.0 $\mu$m. This process was repeated 6 times in all to form a 6-layered wiring on the Si wafer, of which the cross section was observed with SEM. The SEM observation verified that there was almost no difference in surface level in each layer throughout the entire surface of the Si wafer substrate and that the wiring patterns formed were all good and accurate.

Comparative Example 9

In the same manner as in Example 9, an insulating film layer was formed on a semiconductor substrate. Without using the cerium oxide slurry herein, tried was the formation of multi-layered wirings on the substrate. However, in the samples prepared herein to have wirings of 3 or more layers, the difference in surface level was so great that the adjacent upper and lower layers could not ensure the insulating performance therebetween. It was found that multi-layered wirings of 3 or more layers could not be formed in this Comparative Example 9.

On the other hand, polishing of the insulating film layer same as mentioned above was tried with a slurry prepared in the same manner as mentioned above, but using a commercially-available cerium oxide grains, of which the primary grains were found to have an aspect ratio of 3.0 through transmitting electromlcroscopic observation. As a result, about 4,000 Å of the insulating layer was cut off, which was almost the same as that cut off in Example 9, but the surface of the insulating layer polished herein was much scratched. Then, the weight to the holder, which had been 5 kg, was reduced to 1 kg. Using the weight of 1 kg, the polished surface of the layer was not scratched. In this condition, however, only about 500 Å of the layer was cut off even after having been polished at 50 rpm for 10 minutes. Thus, it was found that the performance of this slurry was very poor for flattening the entire surface of Si wafers.

EXAMPLE 10

Formation of Cerium Oxide Grains, 10-1

Fifty grams of cerium carbonate was added to 450 g of deionized water, and dispersed therein with a planetary ball mill at 2800 rpm for 15 minutes to obtain a white, cerium carbonate slurry. With stirring the slurry, 29.2 g of aqueous hydrogen peroxide (about 35%) was dropwise added thereto, reacted for 1 hour with further stirring, and thereafter heated up to 90° C. in a water bath. After having been still stirred for 1 hour at 90° C., this was cooled to room temperature, separated the solid from liquid by a centrifuger, and then dried in a drier at 120° C. for 24 hours to obtain 30 g of a white powder. From its X-ray diffraction pattern, this white powder was Identified as cerium oxide. Its specific surface area as measured through nitrogen adsorption was 111 m$^2$/g; its apparent density as measured in a still standing method was 1.07 g/ml; its apparent density as measured in a tapping method was 1.43 g/ml; its powdery X-ray diffraction pattern gave a main peak, of which the half-value width was 1.38°; the size of the primary grain in the powder was measured through transmitting electromicroscopy to be from about 5 to about 10 nm; the secondary grain size of the secondary grains constituting the powder was measured through scanning electromicroscopy to be about 0.2 μm; and the outline of each of those secondary grains had almost no sharp corners and was gently roundish.

Formation of Cerium Oxide Grains, 10-2

Fifty grams of cerium nitrate was added to 500 g of deionized water, and well mixed. Then, with stirring the resulting mixture, an aqueous solution as prepared by dissolving 75 g of ammonium hydrogencarbonate in 400 g of distilled water was dropwlse added thereto, and reacted as they were for 1 hour at room temperature to give a white precipitate. This white precipitate was separated through centrifugation at 3000 rpm for 10 minutes for solid-liquid separation by a centrifuger. This was again put into 500 g of deionized water and well is dispersed therein. Then, 60.9 g of aqueous hydrogen peroxide (about 35%) was dropwise added to the resulting dispersion and reacted for 1 hour with still stirring it. Next, this was heated up to 90° C. in a water bath. After having been still stirred for 1 hour at 90° C., this was cooled to room temperature, separated the solid from liquid by a centrifuger, and then dried in a drier at 120° C. for 24 hours to obtain 20 g of a white powder. From its X-ray diffraction pattern, this white powder was identified as cerium oxide. Its specific surface area as measured through nitrogen adsorption was 112 m$^2$/g; its apparent density as measured in a still standing method was 1.11 g/ml; its apparent density as measured in a tapping method was 1.52 g/ml; its powdery X-ray diffraction pattern gave a main peak, of which the half-value width was 1.30°; the size of the primary grain in the powder was measured through transmitting electromicroscopy to be from about 2 to about 5 nm; the secondary grain size of the secondary grains constituting the powder was measured through scanning electromicroscopy to be from about 0.2 to about 0.3 μm; and the outline of each of those secondary grains had almost no sharp corners and was gently roundish.

Formation of Cerium Oxide Grains, 10-3

Fifty grams of cerium ammonium nitrate was added to 500 g of deionized water, and well mixed. With stirring the resulting mixture, an aqueous solution as prepared by dissolving 27 g of aqueous ammonia in 500 g of distilled water was dropwise added thereto, and reacted as they were for 1 hour at room temperature to give a white precipitate. This white precipitate was separated through centrifugation at 3000 rpm for 10 minutes for solid-liquid separation by a centrifuger, and then dried in a drier at 120° C. for 24 hours to obtain 15 g of a white powder. From its X-ray diffraction pattern, this white powder was identified as cerium oxide. Its specific surface area as measured through nitrogen adsorption was 130 m$^2$/g; its apparent density as measured in a still standing method was 1.08 g/ml; its apparent density as measured in a tapping method was 1.49 g/ml; its powdery X-ray diffraction pattern gave a main peak, of which the half-value width was 1.44°; the size of the primary grain in the powder was measured through transmitting electromicroscopy to be from about 5 to about 10 nm; the size of the secondary grain in the powder was measured through scanning electromicroscopy to be about 0.2 μm; and the outline of each of those secondary grains had almost no sharp corners and was gently roundish.

Formation of Cerium Oxide Slurries

Two and a half grams of each of those three cerium oxide powders was dispersed in 100 g of deionized water, to which was added 1 g of ammonium polyacrylate, and dispersed with a planetary ball mill (P-5 Model, manufactured by Flitche) at 2800 rpm for 30 minutes. Thus were obtained three milky white cerium oxide slurries. Using a Coulter counter (N-4 Model, manufactured by Nikka-ki), the grain size distribution of each slurry was measured. It was found that the mean grain size of the grains in each slurry was small to be 176 nm, and that each slurry was a mono-dispersed one having a relatively narrow grain size distribution.

Formation of Insulating Layer

A 4-inch Si wafer having thereon an IC circuit and an aluminium wiring pattern in that order was processed in the same manner as in Example 1 to form an insulating layer thereon.

Polishing of Insulating Layer

Using any of the cerium oxide slurries prepared above, the insulating layer formed on the Si wafer was polished in the same manner as in Example 1. Using an automatic ellipsometer, the change in the film thickness of the Si wafer before and after polishing it was determined, which verified that about 4,000 Å of the insulating layer of the Si wafer was cut off through the polishing, resulting in that the thickness of the thus-polished insulating layer was almost completely unified throughout the entire surface of the Si wafer. The thus-polished Si wafer was cut, and its cross section was observed with SEM, which verified that the insulating layer well covered the Si wafer with no defects such as empty pores even in the grooves between the wiring lines having a width of 0.1 μm and a depth of 1.0 μm. This process was repeated 6 times in all to form a 6-layered wiring on the Si water, of which the cross section was observed with SEM. The SEM observation verified that there was almost no difference in surface level in each layer throughout the entire surface of the Si wafer substrate and that the wiring patterns formed were all good and accurate.

Under the same condition, the CVD film (of $SiO_2$) formed on the Si wafer was polished, resulting in that only about 200 Å of the film was cut off. In this, the ratio of the polishing speed for the CVD film to that for the organic SOG film was about 1/20, from which it was confirmed that only the SOG film was well selectively polished with the abrasive used herein.

Comparative Example 10

In the same manner as in Example 10, an insulating film layer was formed on a semiconductor substrate. Without using the cerium oxide slurry herein, tried was the formation of multi-layered wirings on the substrate. However, in the samples prepared heroin to have wirings of 3 or more layers, the difference in surface level was so great that the adjacent upper and lower layers could not ensure the insulating performance therebetween. It was found that multi-layered wirings of 3 or more layers could not be formed in this Comparative Example 9.

On the other hand, the insulating film layer formed herein was polished with a colloidal silica slurry with aqueous ammonia (SS-225, trade name of Cabot). In this, however, only about 400 Å of the layer was polished at 50 rpm for 10 minutes. Thus, it was found that the performance of the colloidal silica slurry abrasive was very poor for flattening the entire surface of Si wafers. Under the same condition, the CVD film formed on the substrate was polished, resulting in that about 400 Å of the film was cut off. In this, therefore, the ratio of the polishing speed for the CVD film to that for the organic SOG film was 1, which indicates that the colloidal silica slurry cannot be used in selectively polishing only the organic SOG film.

What is claimed is:

1. A cerium oxide abrasive for polishing an insulating film formed on predetermined substrates, which comprises a slurry of cerium oxide grains as dispersed in water, wherein said cerium oxide grains are obtained, without being baked, by oxidizing a water-insoluble, trivalent cerium compound as dispersed in water, with an oxidizing agent, wherein said cerium oxide grains have a specific surface area of not smaller than 50 $m^2/g$ and not larger than 500 $m^2/g$, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 $\mu$m are not smaller than 90% of the total number of the secondary grains, and said secondary grains each give an outline with no edges having an angle of smaller than 120°; and a powdery X-ray diffraction pattern of said cerium oxide grains gives a main peak having a half-value width of not smaller than 0.4° and not larger than 0.5°.

2. The cerium oxide abrasive as claimed in claim 1, in which said oxidizing agent is hydrogen peroxide.

3. The cerium oxide abrasive according to claim 1, wherein
said cerium oxide grains have an apparent density as measured in a tapping method of not larger than 1.60 g/ml.

4. The cerium oxide abrasive according to claim 1, wherein
the number of primary grains of said cerium oxide grains having an aspect ratio of not larger than 2.0 are not smaller than 90% of the total number of the primary grains.

5. The cerium oxide abrasive as claimed in claim 2, in which said slurry contains a dispersant.

6. The cerium oxide abrasive as claimed in claim 5, in which said dispersant is at least one selected from water-soluble organic polymers, water-soluble anionic surfactants, water-soluble nonionic surfactants, and water-soluble amines.

7. The cerium oxide abrasive as claimed in claim 1, in which said slurry is an alkaline slurry.

8. The cerium oxide abrasive as claimed in claim 7, in which said slurry has a pH of from 8 to 12.

9. The cerium oxide abrasive as claimed in claim 1, in which said slurry comprises not larger than 10 parts by weight of said cerium oxide grains as dispersed in 100 parts by weight of an aqueous solvent.

10. The cerium oxide abrasive according to claim 1 wherein said cerium oxide grains are obtained without being heated at higher than 120° C.

11. A cerium oxide abrasive for polishing an insulating film formed on predetermined substrates as recited in claim 1, wherein said slurry is made by dispersing the primary and secondary cerium oxide grains in water.

12. A cerium oxide abrasive for polishing an insulating film formed on predetermined substrates, which comprises a slurry of cerium oxide grains as dispersed in water, wherein said cerium oxide grains are obtained, without being baked, by oxidizing a water-insoluble cerium compound as prepared from an aqueous solution of a water-soluble, trivalent cerium compound, with an oxidizing agent, wherein said cerium oxide grains have a specific surface area of not smaller than 50 $m^2/g$ and not larger than 500 $m^2/g$, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 $\mu$m are not smaller than 90% of the total number of the secondary grains, and said secondary grains each give an outline with no edges having an angle of smaller than 120° and a powdery X-ray diffraction pattern of said cerium oxide grains gives a main peak having a half-value width of not smaller than 0.4° and not larger than 0.5°.

13. The cerium oxide abrasive according to claim 12 wherein said cerium oxide grains are obtained without being heated at higher than 120° C.

14. The cerium oxide abrasive according to claim 12, wherein
said cerium oxide grains have an apparent density as measured in a tapping method of not larger than 1.60 g/ml.

15. The cerium oxide abrasive according to claim 12, wherein
the number of primary grains of said cerium oxide grains having an aspect ratio of not larger than 2.0 are not smaller than 90% of the total number of the primary grains.

16. The cerium oxide abrasive as claimed in claim 12, in which said slurry contains a dispersant.

17. The cerium oxide abrasive as claimed in claim 16, in which said dispersant is at least one selected from water-soluble organic polymers, water-soluble anionic surfactants, water-soluble nonionic surfactants, and water-soluble amines.

18. The cerium oxide abrasive as claimed in claim 12, in which said slurry is an alkaline slurry.

19. The cerium oxide abrasive as claimed in claim 18, in which said slurry has a pH of from 8 to 12.

20. The cerium oxide abrasive as claimed in claim 12, in which said slurry comprises not larger than 10 parts by weight of said cerium oxide grains as dispersed in 100 parts by weight of an aqueous solvent.

21. The cerium oxide abrasive as claimed in claim 12, in which said oxidizing agent is hydrogen peroxide.

22. A cerium oxide abrasive for polishing an insulating film formed on predetermined substrates, which comprises a slurry of cerium oxide grains as dispersed in water, wherein said cerium oxide grains are obtained, without being baked, by neutralizing or alkalifying an aqueous solution of a tetravalent cerium compound, wherein said cerium oxide grains have a specific surface area of not smaller than 50 $m^2/g$ and not larger than 500 $m^2/g$, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 μm are not smaller than 90% of the total number of the secondary grains, and said secondary grains each give an outline with no edges having an angle of smaller than 120°; and a powdery X-ray diffraction pattern of said cerium oxide grains gives a main peak having a half-value width of not smaller than 0.4° and not larger than 0.5°.

23. The cerium oxide abrasive according to claim 22 wherein said cerium oxide grains are obtained without being heated at higher than 120° C.

24. The cerium oxide abrasive according to claim 22, wherein
said cerium oxide grains have an apparent density as measured in a tapping method of not larger than 1.60 g/ml.

25. The cerium oxide abrasive according to claim 22, wherein
the number of primary grains of said cerium oxide grains having an aspect ratio of not larger than 2.0 are not smaller than 90% of the total number of the primary grains.

26. The cerium oxide abrasive as claimed in claim 22, in which said slurry contains a dispersant.

27. The cerium oxide abrasive as claimed in claim 26, in which said dispersant is at least one selected from water-soluble organic polymers, water-soluble anionic surfactants, water-soluble nonionic surfactants, and water-soluble amines.

28. The cerium oxide abrasive as claimed in claim 22, in which said slurry is an alkaline slurry.

29. The cerium oxide abrasive as claimed in claim 28, in which said slurry has a pH of from 8 to 12.

30. The cerium oxide abrasive as claimed in claim 22, in which said slurry comprises not larger than 10 parts by weight of said cerium oxide grains as dispersed in 100 parts by weight of an aqueous solvent.

31. A method for producing a cerium oxide abrasive comprising a slurry of oxide grains dispersed in water, the method comprising the steps of:
producing cerium oxide grains without baking by oxidizing a water-insoluble, trivalent cerium compound dispersed in water with an oxidizing agent, wherein the cerium oxide grains produced have a specific surface area of not smaller than 50 m$^2$/g and not larger than 500 m$^2$/g, and an apparent density as measured in a still standing method of 0.8 g/ml to 1.30 g/ml, wherein the number of primary grains of the cerium oxide grains having a primary grain size of not larger than 10 nm are not smaller than 90% of the total number of primary grains;
aggregating primary grains to form secondary grains, wherein the number of secondary grains formed through aggregation of the primary grains to have a secondary grain size of not larger than 1 μm are not smaller than 90% of the total number of the secondary grains, and the secondary grains each give an outline with no edges having an angle of smaller than 120°; and a powdery X-ray diffraction pattern of the cerium oxide grains gives a main peak having a half-value width of not smaller than 0.4° and not larger than 0.5°; and
dispersing the primary and secondary cerium oxide grains in water to prepare a slurry.

32. A method for polishing a substrate comprising the steps of:
forming an insulating film containing a compound having an organic group on a predetermined substrate; and
polishing said insulating film with a cerium oxide abrasive, wherein the cerium oxide abrasive comprises a slurry of cerium oxide grains as dispersed in water, wherein said cerium oxide grains are obtained, without being baked, by oxidizing a water-insoluble, trivalent cerium compound as dispersed in water, with an oxidizing agent, wherein said cerium oxide grains have a specific surface area of not smaller than 50 m$^2$/g and not larger than 500 m$^2$/g, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 μm are not smaller than 90% of the total number of the secondary grains, and said secondary grains each give an outline with no edges having an angle of smaller than 120°; and a powdery X-ray diffraction pattern of said cerium oxide grains gives a main peak having a half-value width of not smaller than 0.4° and not larger than 0.5°.

33. The method for polishing a substrate as claimed in claim 32, in which said predetermined substrate is a semiconductor substrate.

34. The method for polishing a substrate as claimed in claim 32, in which said insulating film comprises an insulating layer containing a compound having an organic group.

35. The method for polishing a substrate as claimed in claim 34, in which said insulating layer containing said compound having said organic group is formed by applying a coating liquid as prepared through hydrolysis of an alkoxysilane and an alkylalkoxysilane in the presence of water and a catalyst in an organic solvent, onto a substrate, followed by curing it under heat.

36. The method for polishing a substrate as claimed in claim 35, in which a number of Si atoms derived from a siloxane bond and a number of C atoms derived from an alkyl group have a relationship as follows:

$$(\text{Number of C atoms})/[(\text{Number of Si atoms})+(\text{Number of C atoms})] \geq 0.1$$

in said insulating layer containing a compound having an organic group.

37. The method for polishing a substrate as claimed in claim 32, in which said insulating film comprises a silicon-free, organic polymer resin layer.

38. The method for polishing a substrate as claimed in claim 32, which further comprises a step of washing the substrate, after the polishing of its insulating film layer, with a liquid comprising:
(a) hydrogen peroxide, and
(b) at least one selected from nitric acid, sulfuric acid, ammonium carbonate, ammonium carbamate and ammonium hydrogencarbonate.

39. A method for polishing a substrate comprising the steps of:
forming two or more insulating layers of different materials from one another on a predetermined substrate;

selectively polishing at least one of said insulating layers with a cerium oxide abrasive, wherein the cerium oxide abrasive comprises a slurry of cerium oxide grains as dispersed in water, wherein said cerium oxide grains are obtained, without being baked, by oxidizing a water-insoluble, trivalent cerium compound as dispersed in water, with an oxidizing agent, wherein said cerium oxide grains have a specific surface area of not smaller than 50 m$^2$/g and not larger than 500 m$^2$/g, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 μm are not smaller than 90% of the total number of the secondary grains, and said secondary grains each give an outline with no edges having an angle of smaller than 120°; and a powdery X-ray diffraction pattern of said cerium oxide grains gives a main peak having a half-value width of not smaller than 0.4° and not larger than 0.5°.

40. The method for polishing a substrate as claimed in claim 39, in which said insulating film comprises;

an insulating film layer containing a compound having an organic group, which is formed by applying a coating liquid as prepared through hydrolysis of an alkoxysilane and an alkylalkoxysilane in the presence of water and a catalyst in an organic solvent, onto said substrate, followed by curing it under heat: and an insulating SiO$_2$ film layer;

and in which said insulating film layer containing said compound having said organic group is selectively polished with said abrasive.

41. The method for polishing a substrate as claimed in claim 39, in which said polishing is implemented with said cerium oxide abrasive having a ratio of a polishing speed for a first insulating film layer to a polishing speed for a second insulating film layer not smaller than 10.

42. The method for polishing a substrate as claimed in claim 40, in which said polishing is implemented with said cerium oxide abrasive having a ratio of a polishing speed for the insulating film layer containing an organic compound to a polishing speed for the insulating SiO$_2$ film layer is not smaller than 10.

43. A method for producing a semiconductor chip comprising the steps of:

forming an insulating film that comprises an insulating layer containing a compound having an organic group on a predetermined semiconductor substrate; and polishing said insulating film layer containing said compound having said organic group with a cerium oxide abrasive comprising a slurry of cerium oxide grains as dispersed in water, wherein said cerium oxide grains are obtained, without being baked, by oxidizing a water-insoluble, trivalent cerium compound as dispersed in water, with an oxidizing agent, wherein said cerium oxide grains have a specific surface area of not smaller than 50 m$^2$/g and not larger than 500 m$^2$/g, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 μm are not smaller than 90% of the total number of the secondary grains, and said secondary grains each give an outline with no edges having an angle of smaller than 120°; and a powdery X-ray diffraction pattern of said cerium oxide grains gives a main peak having a half-value width of not smaller than 0.4° and not larger than 0.5°.

44. The method for producing a semiconductor chip as claimed in claim 43, in which said insulating layer containing said compound is formed by applying a coating liquid as prepared through hydrolysis of an alkoxysilane and an alkylalkoxysilane in the presence of water and a catalyst in an organic solvent, onto said substrate, followed by curing it under heat.

45. The method for producing a semiconductor chip as claimed in claim 44, in which a number of Si atoms derived from a siloxane bond and a number of C atoms derived from an alkyl group have a relationship as follows:

(Number of C atoms)/[(Number of Si atoms)+(Number of C atoms)]≧0.1.

46. A method for producing a cerium oxide abrasive comprising a slurry of cerium oxide grains dispersed in water, the method comprising the steps of:

producing cerium oxide grains without baking by oxidizing a water-insoluble, trivalent cerium compound as prepared from an aqueous solution of a water-soluble, trivalent cerium compound with an oxidizing agent, wherein the cerium oxide grains have a specific surface area of not smaller than 50 m$^2$/g and not larger than 500 m$^2$/g, and an apparent density as measured in a still standing method of 0.8 g/ml to 1.30 g/ml, wherein the number of primary grains of the cerium oxide grains having a primary grain size of not larger than 10 nm are not smaller than 90% of the total number of primary grains;

aggregating primary grains to form secondary grains, wherein the number of secondary grains formed through aggregation of the primary grains to have a secondary grain size of not larger than 1 μm are not smaller than 90% of the total number of the secondary grains, and the secondary grains each give an outline with no edges having an angle of smaller than 120°; and a powdery X-ray diffraction pattern of said cerium oxide grains gives a main peak having a half value width of not smaller than 0.4° and not larger than 0.5°; and dispersing the primary and secondary cerium oxide grains in water to prepare a slurry.

47. A method for polishing a substrate comprising the steps of:

forming an insulating film on a predetermined substrate; and polishing said insulating film containing a compound having an organic group with a cerium oxide abrasive, wherein the cerium oxide abrasive comprises a slurry of cerium oxide grains as dispersed in water, wherein said cerium oxide grains are obtained, without being baked, by oxidizing a water-insoluble cerium compound as prepared from an aqueous solution of a water-soluble, trivalent cerium compound, with an oxidizing agent, wherein said cerium oxide grains have a specific surface area of not smaller than 50 m$^2$/g and not larger than 500 m²/g, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 μm are not smaller than 90% of the total number of the secondary grains, and said secondary grains each give an outline with no edges having an angle of smaller than 120°; and a powdery X-ray diffraction pattern of said cerium oxide grains gives a main peak having a half-value width of not smaller than 0.4° and not larger than 0.5°.

48. The method for polishing a substrate as claimed in claim 47, in which said predetermined substrate is a semiconductor substrate.

49. The method for polishing a substrate as claimed in claim 47, in which said insulating film comprises an insulating layer containing a compound having an organic group.

50. The method for polishing a substrate as claimed in claim 49, in which said insulating layer containing said compound having said organic group is formed by applying a coating liquid as prepared through hydrolysis of an alkoxysilane and an alkylalkoxysilane in the presence of water and a catalyst in an organic solvent, onto a substrate, followed by curing it under heat.

51. The method for polishing a substrate as claimed in claim 50, in which a number of Si atoms derived from a siloxane bond and a number of C atoms derived from an alkyl group have a relationship as follows:

(Number of C atoms)/[(Number of Si atoms)+(Number of C atoms)]≧0.1 in said insulating layer containing a compound having an organic group.

52. The method for polishing a substrate as claimed in claim 47, in which said insulating film comprises a silicon-free, organic polymer resin layer.

53. The method for polishing a substrate as claimed in claim 47, which further comprises a step of washing the substrate, after the polishing of its insulating film layer, with a liquid comprising:

(a) hydrogen peroxide, and (b) at least one selected from nitric acid, sulfuric acid, ammonium carbonate, ammonium carbamate and ammonium hydrogencarbonate.

54. A method for polishing a substrate comprising the steps of:

forming two or more insulating layers of different materials from one another on a predetermined substrate; and selectively polishing at least one of said insulating layers with a cerium oxide abrasive, wherein the cerium oxide abrasive comprises a slurry of cerium oxide grains as dispersed in water, wherein said cerium oxide grains are obtained, without being baked, by oxidizing a water-insoluble cerium compound as prepared from an aqueous solution of a water-soluble, trivalent cerium compound, with an oxidizing agent, wherein said cerium oxide grains have a specific surface area of not smaller than 50 m²/g and not larger than 500 m²/g, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 μm are not smaller than 90% of the total number of the secondary grains, and said secondary grains each give an outline with no edges having an angle of smaller than 120°; and a powdery X-ray diffraction pattern of said cerium oxide grains gives a main peak having a half-value width of not smaller than 0.4° and not larger than 0.5°.

55. The method for polishing a substrate as claimed in claim 54, in which said insulating film comprises:

an insulating film layer containing a compound having an organic group, which is formed by applying a coating liquid as prepared through hydrolysis of an alkoxysilane and an alkylalkoxysilane in the presence of water and a catalyst in an organic solvent, onto said substrate, followed by curing it under heat; and an insulating $SiO_2$ film layer;

and in which said insulating film layer containing said compound having said organic group is selectively polished with said abrasive.

56. The method for polishing a substrate as claimed in claim 54, in which said polishing is implemented with said cerium oxide abrasive having a ratio of a polishing speed for a first insulating film layer to a polishing speed for a second insulating film layer not smaller than 10.

57. The method for polishing a substrate as claimed in claim 55, in which said polishing is implemented with said cerium oxide abrasive having a ratio of a polishing speed for the insulating film layer containing an organic compound to a polishing speed for the insulating $SiO_2$ film layer is not smaller than 10.

58. A method for producing a semiconductor chip comprising the steps of:

forming an insulating film that comprises an insulating layer containing a compound having an organic group on a predetermined semiconductor substrate; and polishing said insulating film layer containing said compound having said organic group with a cerium oxide abrasive comprising a slurry of cerium oxide grains as dispersed in water, wherein said cerium oxide grains are obtained, without being baked, by oxidizing a water-insoluble cerium compound as prepared from an aqueous solution of a water-soluble, trivalent cerium compound, with an oxidizing agent,, wherein said cerium oxide grains have a specific surface area of not smaller than 50 m²/g and not larger than 500 m²/g, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 μm are not smaller than 90% of the total number of the secondary grains, and said secondary grains each give an outline with no edges having an angle of smaller than 120°; and a powdery X-ray diffraction pattern of said cerium oxide grains gives a main peak having a half-value width of not smaller than 0.4° and not larger than 0.5°.

59. The method for producing a semiconductor chip as claimed in claim 58, in which said insulating layer containing said compound is formed by applying a coating liquid as prepared through hydrolysis of an alkoxysilane and an alkylalkoxysilane in the presence of water and a catalyst in an organic solvent, onto said substrate, followed by curing it under heat.

60. The method for producing a semiconductor chip as claimed in claim 59, in which a number of Si atoms derived from a siloxane bond and a number of C atoms derived from an alkyl group have a relationship as follows:

(Number of C atoms)/[(Number of Si atoms)+(Number of C atoms)]≧0.1.

61. A method for producing a cerium oxide abrasive comprising a slurry of cerium oxide grains dispersed in water, the method comprising the steps of:
producing cerium oxide grains without baking by neutralizing or alkalifying an aqueous solution of a tetravalent cerium compound, wherein the cerium oxide grains have a specific surface area of not smaller than 50 m$^2$/g and not larger than 500 m$^2$/g, and an apparent density as measured in a still standing method of 0.8 g/ml to 1.30 g/ml, wherein the number of primary grains of the cerium oxide grains having a primary grain size of not larger than 10 nm are not smaller than 90% of the total number of primary grains;
aggregating primary grains to form secondary grains, wherein the number of secondary grains formed through aggregation of the primary grains to have a secondary grain size of not larger than 1 μm are not smaller than 90% of the total number of the secondary grains, and the secondary grains each give an outline with no edges having an angle of smaller than 120°; and a powdery X-ray diffraction pattern of the cerium oxide grains gives a main peak having a half-value width of not smaller than 0.4° and not larger than 0.5°; and
dispersing the primary and secondary cerium oxide grains in water to prepare a slurry.

62. A method for polishing a substrate comprising the steps of:
forming an insulating film on a predetermined substrate; and
polishing said insulating film containing a compound having an organic group with a cerium oxide abrasive, wherein the cerium oxide abrasive comprises a slurry of cerium oxide grains as dispersed in water, wherein said cerium oxide grains are obtained, without being baked, by neutralizing or alkalifying an aqueous solution of a tetravalent cerium compound, wherein said cerium oxide grains have a specific surface area of not smaller than 50 m$^2$/g and not larger than 500 m$^2$/g, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 μm are not smaller than 90% of the total number of the secondary grains, and said secondary grains each give an outline with no edges having an angle of smaller than 120°; and a powdery X-ray diffraction pattern of said cerium oxide grains gives a main peak having a half-value width of not smaller than 0.4° and not larger than 0.5°.

63. The method for polishing a substrate as claimed in claim 62, in which said predetermined substrate is a semiconductor substrate.

64. The method for polishing a substrate as claimed in claim 62, in which said insulating film comprises an insulating layer containing a compound having an organic group.

65. The method for polishing a substrate as claimed in claim 64, in which said insulating layer containing said compound having said organic group is formed by applying a coating liquid as prepared through hydrolysis of an alkoxysilane and an alkylalkoxysilane in the presence of water and a catalyst in an organic solvent, onto a substrate, followed by curing it under heat.

66. The method for polishing a substrate as claimed in claim 62, in which said insulating film comprises a silicon-free, organic polymer resin layer.

67. The method for polishing a substrate as claimed in claim 65, in which a number of Si atoms derived from a siloxane bond and a number of C atoms derived from an alkyl group have a relationship as follows:

(Number of C atoms)/[(Number of Si atoms)+(Number of C atoms)]≧0.1 in said insulating layer containing a compound having an organic group.

68. The method for polishing a substrate as claimed in claim 62, which further comprises a step of washing the substrate, after the polishing of its insulating film layer, with a liquid comprising:
(a) hydrogen peroxide, and
(b) at least one selected from nitric acid, sulfuric acid, ammonium carbonate, ammonium carbamate and ammonium hydrogencarbonate.

69. A method for polishing a substrate comprising the steps of:
forming two or more insulating layers of different in materials from one another on a predetermined substrate; and
selectively polishing at least one of said insulating layers with a cerium oxide abrasive, wherein the cerium oxide abrasive comprises a slurry of cerium oxide grains as dispersed in water, wherein said cerium oxide grains are obtained, without being baked, by neutralizing or alkalifying an aqueous solution of a tetravalent cerium compound, wherein said cerium oxide grains have a specific surface area of not smaller than 50 m$^2$/g and not larger than 500 m$^2$/g, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 μm are not smaller than 90% of the total number of the secondary grains, and said secondary grains each give an outline with no edges having an angle of smaller than 120°; and a powdery X-ray diffraction pattern of said cerium oxide grains gives a main peak having a half-value width of not smaller than 0.4° and not larger than 0.5°.

70. The method for polishing a substrate as claimed in claim 69, in which said insulating film comprises:
an insulating film layer containing a compound having an organic group, which is formed by applying a coating liquid as prepared through hydrolysis of an alkoxysilane and an alkylalkoxysilane in the presence of water and a catalyst in an organic solvent, onto said substrate, followed by curing it under heat; and an insulating $SiO_2$ film layer;
and in which said insulating film layer containing said compound having said organic group is selectively polished with said abrasive.

71. The method for polishing a substrate as claimed in claim 70, in which said polishing is implemented with said cerium oxide abrasive having a ratio of a polishing speed for the insulating film layer containing an organic compound to a polishing speed for the insulating $SiO_2$ film layer is not smaller than 10.

72. The method for polishing a substrate as claimed in claim 69, in which said polishing is implemented with said cerium oxide abrasive having a ratio of a polishing speed for a first insulating film layer to a polishing speed for a second insulating film layer not smaller than 10.

73. A method for producing a semiconductor chip comprising the steps of:
forming an insulating film that comprises an insulating layer containing a compound having an organic group on a predetermined semiconductor substrate; and
polishing said insulating film layer containing said compound having said organic group with a cerium oxide abrasive comprising a slurry of cerium oxide grains as dispersed in water, wherein said cerium oxide grains are obtained, without being baked, by neutralizing or alkalifying an aqueous solution of a tetravalent cerium compound, wherein said cerium oxide grains have a specific surface area of not smaller than 50 $m^2/g$ and not larger than 500 $m^2/g$, and an apparent density as measured in a still standing method of 0.8 g/ml to 1.30 g/ml, wherein the number of primary grains of said cerium oxide grains having a primary grain size of not larger than 10 nm are not smaller than 90% of the total number of primary grains; wherein the number secondary grains as formed through aggregation of said primary grains so that to have a secondary grain size of not larger than 1 µm are not smaller than 90% of the total number of the secondary grains, and said secondary grains each give an outline with no edges having an angle of smaller than 120°; and a powdery X-ray diffraction pattern of said cerium oxide grains gives a main peak having a half-value width of not smaller than 0.4° and not larger than 0.5°.

74. The method for producing a semiconductor chip as claimed in claim 73, in which said insulating layer containing said compound is formed by applying a coating liquid as prepared through hydrolysis of an alkoxysilane and an alkylalkoxysilane in the presence of water and a catalyst in an organic solvent, onto said substrate, followed by curing it under heat.

75. The method for producing a semiconductor chip as claimed in claim 74, in which a number of Si atoms derived from a siloxane bond and a number of C atoms derived from an alkyl group have a relationship as follows:

(Number of C atoms)/[(Number of Si atoms)+(Number of C atoms)]≧0.1.

* * * * *